(12) United States Patent
Fukuda et al.

(10) Patent No.: US 11,091,627 B2
(45) Date of Patent: Aug. 17, 2021

(54) EPOXY RESIN COMPOSITION

(71) Applicant: SUMITOMO SEIKA CHEMICALS CO., LTD., Hyogo (JP)

(72) Inventors: Noriaki Fukuda, Kako-gun (JP); Ryota Harisaki, Kako-gun (JP); Katsumasa Yamamoto, Kako-gun (JP)

(73) Assignee: SUMITOMO SEIKA CHEMICALS CO., LTD., Hyogo (JP)

( * ) Notice: Subject to any disclaimer, the term of this patent is extended or adjusted under 35 U.S.C. 154(b) by 92 days.

(21) Appl. No.: 16/476,681

(22) PCT Filed: Jan. 9, 2018

(86) PCT No.: PCT/JP2018/000203
§ 371 (c)(1),
(2) Date: Jul. 9, 2019

(87) PCT Pub. No.: WO2018/131571
PCT Pub. Date: Jul. 19, 2018

(65) Prior Publication Data
US 2019/0322858 A1    Oct. 24, 2019

(30) Foreign Application Priority Data
Jan. 10, 2017    (JP) .............................. JP2017-002216

(51) Int. Cl.
| C08L 63/00 | (2006.01) |
| C09D 153/00 | (2006.01) |
| C09D 163/00 | (2006.01) |
| C09J 163/00 | (2006.01) |
| C08L 53/00 | (2006.01) |
| C09D 7/20 | (2018.01) |
| C08L 71/12 | (2006.01) |
| C09D 171/12 | (2006.01) |
| C09J 153/00 | (2006.01) |
| C09J 171/12 | (2006.01) |
| C09K 3/10 | (2006.01) |
| H01L 23/29 | (2006.01) |
| H05K 1/03 | (2006.01) |
| H05K 9/00 | (2006.01) |

(52) U.S. Cl.
CPC ............. *C08L 53/005* (2013.01); *C08L 63/00* (2013.01); *C08L 71/12* (2013.01); *C09D 7/20* (2018.01); *C09D 153/005* (2013.01); *C09D 163/00* (2013.01); *C09D 171/12* (2013.01); *C09J 153/005* (2013.01); *C09J 163/00* (2013.01); *C09J 171/12* (2013.01); *C09K 3/1018* (2013.01); *H01L 23/296* (2013.01); *H05K 1/0333* (2013.01); *H05K 9/0081* (2013.01); *C08L 2203/16* (2013.01); *C08L 2203/20* (2013.01); *C08L 2205/03* (2013.01); *C09K 2200/0642* (2013.01); *C09K 2200/0657* (2013.01); *C09K 2200/0685* (2013.01); *H05K 2201/0162* (2013.01)

(58) Field of Classification Search
CPC ..... C08L 63/00; C08L 51/06; C08G 59/3281; C08G 59/306
See application file for complete search history.

(56) References Cited

U.S. PATENT DOCUMENTS

| 3,445,483 | A | 5/1969 | Chaffee |
| 4,801,645 | A * | 1/1989 | Nishio .................... C08L 23/10 |
| | | | 525/65 |
| 5,639,413 | A | 6/1997 | Crivello |
| 5,863,970 | A | 1/1999 | Ghoshal et al. |
| 6,194,490 | B1 | 2/2001 | Roth et al. |
| 6,779,656 | B2 | 8/2004 | Klettke et al. |
| 6,908,953 | B2 | 6/2005 | Weinmann et al. |
| 7,235,602 | B2 | 6/2007 | Klettke et al. |
| 7,368,524 | B2 | 5/2008 | Eckert et al. |
| 7,740,482 | B2 | 6/2010 | Frances et al. |
| 7,799,846 | B2 | 9/2010 | Eckert et al. |
| 7,893,130 | B2 | 2/2011 | Frances |
| 8,715,905 | B2 | 5/2014 | Tagami et al. |
| 2003/0035899 | A1 | 2/2003 | Klettke et al. |
| 2004/0122186 | A1 | 6/2004 | Herr et al. |
| 2004/0186202 | A1 | 9/2004 | Klettke et al. |
| 2008/0071035 | A1 | 3/2008 | Delsman et al. |
| 2010/0035003 | A1 | 2/2010 | Frances et al. |
| 2010/0273937 | A1 | 10/2010 | Tajima et al. |
| 2011/0076465 | A1 | 3/2011 | Takeda et al. |
| 2011/0120761 | A1 | 5/2011 | Kawai |
| 2011/0311788 | A1 | 12/2011 | Tagami et al. |
| 2013/0320264 | A1 | 12/2013 | Yoshida et al. |
| 2015/0034960 | A1 | 2/2015 | Windisch |

(Continued)

FOREIGN PATENT DOCUMENTS

| EP | 1 679 328 A1 | 7/2006 |
| GB | 1123960 A | 8/1968 |

(Continued)

OTHER PUBLICATIONS

Extended European Search Report dated Jun. 23, 2020 by the European Patent Office in application No. 18738684.2.
Extended European Search Report dated Jun. 9, 2020 by the European Patent Office in application No. 18738880.6.
Non-Final Office Action dated Sep. 16, 2020 issued in U.S. Appl. No. 16/476,714.
Communication dated Mar. 21, 2019, issued by the U.S. Patent and Trademark Office in U.S. Appl. No. 15/776,501.
Extended European Search Report dated Jan. 24, 2019 for EP Patent Application No. 16824381.4 relating to U.S. Appl. No. 15/743,189 and U.S. Appl. No. 15/776,501.

(Continued)

*Primary Examiner* — Jeffrey C Mullis
(74) *Attorney, Agent, or Firm* — Sughrue Mion, PLLC

(57) ABSTRACT

Provided is an epoxy resin composition having excellent adhesion and low dielectric characteristics. Specifically, provided is an epoxy resin composition comprising an acid-modified polyolefin resin and an epoxy resin having a specific structure.

13 Claims, No Drawings

(56) References Cited

U.S. PATENT DOCUMENTS

| | | |
|---|---|---|
| 2015/0368397 A1 | 12/2015 | Suwa et al. |
| 2016/0237202 A1 | 8/2016 | Shiobara et al. |
| 2016/0255718 A1 | 9/2016 | Xin et al. |
| 2016/0355711 A1 | 12/2016 | Okamoto et al. |
| 2016/0357105 A1 | 12/2016 | Asai et al. |
| 2018/0327595 A1 | 11/2018 | Fukuda et al. |
| 2018/0334594 A1* | 11/2018 | Nishijima .................. C09J 7/35 |
| 2019/0070837 A1 | 3/2019 | Ichioka et al. |
| 2019/0119434 A1 | 4/2019 | Fukuda et al. |

FOREIGN PATENT DOCUMENTS

| | | |
|---|---|---|
| JP | H05-020447 B2 | 3/1993 |
| JP | 6-192393 A | 7/1994 |
| JP | 7-157540 A | 6/1995 |
| JP | 8-325355 A | 12/1996 |
| JP | 9-48839 A | 2/1997 |
| JP | 10-335768 A | 12/1998 |
| JP | 2001-240654 A | 9/2001 |
| JP | 2003-2953 A | 1/2003 |
| JP | 2003-519705 A | 6/2003 |
| JP | 2003-321482 A | 11/2003 |
| JP | 2004-231728 A | 8/2004 |
| JP | 2004-527602 A | 9/2004 |
| JP | 2004-277460 A | 10/2004 |
| JP | 2005-187800 A | 7/2005 |
| JP | 2005-272492 A | 10/2005 |
| JP | 2006-176762 A | 7/2006 |
| JP | 2007-254709 A | 10/2007 |
| JP | 2008-505945 A | 2/2008 |
| JP | 2008-506697 A | 3/2008 |
| JP | 2009-227992 A | 10/2009 |
| JP | 2009-544785 A | 12/2009 |
| JP | 2010-215858 A | 9/2010 |
| JP | 2010-254814 A | 11/2010 |
| JP | 2011-94115 A | 5/2011 |
| JP | 2012-1668 A | 1/2012 |
| JP | 4849654 B2 | 1/2012 |
| JP | 2012-162585 A | 8/2012 |
| JP | 2013-166941 A | 8/2013 |
| JP | 2014-177530 A | 9/2014 |
| JP | 2016-069548 A | 5/2016 |
| JP | 2016-079354 A | 5/2016 |
| JP | 2016-117904 A | 6/2016 |
| JP | 2017-3707 A | 1/2017 |
| JP | 2017-019983 A | 1/2017 |
| JP | 2019-048906 A | 3/2019 |
| WO | 2006/005369 A1 | 1/2006 |
| WO | 2006/019797 A1 | 2/2006 |
| WO | 2012/042796 A1 | 4/2012 |
| WO | 2012/111765 A1 | 8/2012 |
| WO | 2013/140601 A1 | 9/2013 |
| WO | 2014/046095 A1 | 3/2014 |
| WO | 2014/147903 A1 | 9/2014 |
| WO | 2015/041325 A1 | 3/2015 |
| WO | 2015/093281 A1 | 6/2015 |
| WO | 2017/010401 A1 | 1/2017 |
| WO | 2017/086368 A1 | 5/2017 |
| WO | 2018/131563 A1 | 7/2018 |
| WO | 2018/131564 A1 | 7/2018 |
| WO | 2018/131567 A1 | 7/2018 |
| WO | 2018/131569 A1 | 7/2018 |
| WO | 2018/131570 A1 | 7/2018 |
| WO | 2018/131571 A1 | 7/2018 |
| WO | 2018/181719 A1 | 10/2018 |
| WO | 2019/026822 A1 | 2/2019 |

OTHER PUBLICATIONS

J. V. Crivello et al., "The Synthesis and Cationic Polymerization of Multifunctional Silicon-Containing Epoxy Monomers and Oligomers", Journal of Polymer Science, Part A: Polymer Chemistry, 1994, pp. 683-697, vol. 32, No. 4.

Tomikazu Ueno, "Elastomer modification of epoxy resin" (modification effect of particulate crosslinked elastomer), 23rd Open Technical Lecture, Japan Society of Epoxy Resin Technology, 1999, 12 pages.

Xin Yang et al., "Synthesis and Properties of Silphenylene-containing Epoxy Resins with High UV-stability", Journal of Macromolecular Science, Part A: Pure and Applied Chemistry, 2011, pp. 692-700, vol. 48, No. 9.

International Search Report for PCT/JP2018/000200 dated Apr. 17, 2018 [PCT/ISA/210] corresponding to U.S. Appl. No. 16/476,679.

International Search Report for PCT/JP2018/000203 dated Apr. 17, 2018 [PCT/ISA/210].

International Search Report for PCT/JP2018/000198 dated Apr. 17, 2018 [PCT/ISA/210] corresponding to U.S. Appl. No. 16/476,714.

International Search Report for PCT/JP2018/000202 dated Apr. 17, 2018 [PCT/ISA/210] corresponding to U.S. Appl. No. 16/476,695.

International Search Report for PCT/JP2018/000192 dated Apr. 17, 2018 [PCT/ISA/210] corresponding to U.S. Appl. No. 16/476,721.

International Search Report of PCT/JP2016/084031 dated Jan. 31, 2017 [PCT/ISA/210] corresponding to U.S. Appl. No. 15/776,501.

International Search Report for PCT/JP2018/013257 dated Jun. 26, 2018 [PCT/ISA/210] relating to U.S. Appl. No. 15/743,189 and U.S. Appl. No. 15/776,501.

International Search Report for PCT/JP2016/070158 dated Sep. 20, 2016 [PCT/ISA/210] corresponding to U.S. Appl. No. 15/743,189.

Office Action dated Feb. 5, 2021 issued by the USPTO in U.S. Appl. No. 16/476,721.

Non-Final Office Action dated Dec. 10, 2020 issued in U.S. Appl. No. 16/882,016.

Office Action dated Apr. 2, 2021 from the U.S. Patent & Trademark Office in U.S. Appl. No. 16/476,679.

Communication dated May 7, 2021 issued by the European Patent Office in EP application No. 18738683.4, corresponding to U.S. Appl. No. 16/476,721.

"Poly(2,6-dimethyl-1,4-phenylene oxide) analytical standard", Website Sigma Aldrich, PPE, article 181803, Apr. 23, 2021, pp. 1-2 (2 pages total).

* cited by examiner

EPOXY RESIN COMPOSITION

CROSS REFERENCE TO RELATED APPLICATIONS

This application is a National Stage of International Application No. PCT/JP2018/000203 filed Jan. 9, 2018, claiming priority based on Japanese Patent Application No. 2017-002216 filed Jan. 10, 2017.

TECHNICAL FIELD

The present invention relates to an epoxy resin composition, a method for producing the composition, use of the composition, etc.

BACKGROUND ART

Epoxy resins, which are a type of thermosetting resin, are used in various fields, such as electric and electronic materials, coating compositions, adhesives, and composite materials, because cured products thereof have excellent heat resistance, electrical insulating properties, and like characteristics. Particularly in the field of electric and electronic materials, epoxy resins are used in semiconductor sealing materials, printed circuit board materials, etc.

The frequency of transmission signals has recently increased along with an increase in the performance of electronic devices and a reduction in the weight and size thereof. In accordance with the increased frequency, rigid substrates, flexible printed circuit boards, and their related components are strongly required to have a lower dielectric constant in the high-frequency region, and they have been the subject of study. For example, PTL 1 and PTL 2 each disclose an epoxy resin composition comprising an acid-modified polyolefin resin and an epoxy resin. Further, PTL 3 discloses an epoxy resin containing a silicon atom.

CITATION LIST

Patent Literature

PTL 1: WO2014/147903
PTL 2: JP4849654B
PTL 2: GB1123960B

SUMMARY OF INVENTION

Technical Problem

In PTL 1 and PTL 2, consideration was made to obtain an epoxy resin composition having excellent adhesion and dielectric characteristics using an acid-modified polyolefin resin and an epoxy resin; however, it is still not sufficient. Moreover, there was a risk that their characteristics would be remarkably deteriorated due to a moisture-absorbing environment etc.

Accordingly, an object of the present invention is to provide an epoxy resin composition having excellent adhesion and low dielectric characteristics.

Solution to Problem

As a result of extensive research to solve the above problem, the present inventors found that an epoxy resin composition comprising an epoxy resin having a specific chemical structure and a polyolefin resin modified with an acid (an acid-modified polyolefin resin) has excellent adhesion and low dielectric characteristics. The present invention has been completed upon further studies.

The present invention includes the main subjects shown below.

Item 1. An epoxy resin composition comprising an epoxy resin and an acid-modified polyolefin resin, the epoxy resin being represented by the formula (1):

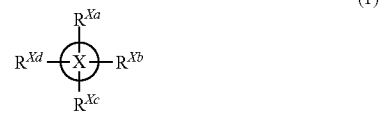

wherein X ring is a saturated hydrocarbon ring or an unsaturated hydrocarbon ring, or rings having a structure in which 2 to 6 saturated hydrocarbon rings and/or unsaturated hydrocarbon rings are condensed, or in which 2 saturated hydrocarbon rings and/or unsaturated hydrocarbon rings are connected;

$R^{Xa}$, $R^{Xb}$, $R^{Xc}$, and $R^{Xd}$ are the same or different, and each is a hydrogen atom, a lower alkyl group, a lower alkoxy group, a lower alkenyl group, a halogen atom, or a group represented by the formula (3):

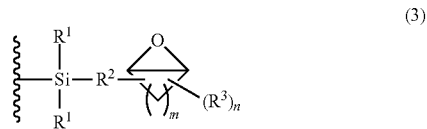

wherein $R^1$ is the same or different, and is a $C_{1-18}$ alkyl group, a $C_{2-9}$ alkenyl group, a cycloalkyl group, an aryl group, or an aralkyl group, wherein one or more carbon atoms of these groups may be replaced by at least one atom selected from the group consisting of an oxygen atom and a nitrogen atom;

$R^2$ is a $C_{1-18}$ alkylene group, wherein one or more carbon atoms of this group other than a carbon atom directly bonded to a silicon atom may be replaced by at least one atom selected from the group consisting of an oxygen atom and a nitrogen atom;

$R^3$ is the same or different, and is a $C_{1-18}$ alkyl group, a $C_{2-9}$ alkenyl group, a cycloalkyl group, an aryl group, or an aralkyl group, wherein one or more carbon atoms of these groups may be replaced by at least one atom selected from the group consisting of an oxygen atom and a nitrogen atom;

m is an integer of 0 to 6; and n is an integer of 0 to 3;

provided that at least one of $R^{Xa}$, $R^{Xb}$, $R^{Xc}$, and $R^{Xd}$ is a group represented by the formula (3); and one or more hydrogen atoms bonded to one or more carbon atoms that constitute the hydrocarbon ring constituting the X ring, and that are not bonded to $R^{Xa}$, $R^{Xb}$, $R^{Xc}$, or $R^{Xd}$, may be replaced by a lower alkyl group, a lower alkoxy group, a lower alkenyl group, or a halogen atom.

Item 2. The epoxy resin composition according to Item 1, wherein the rings having a structure in which 2 saturated hydrocarbon rings and/or unsaturated hydrocarbon rings are connected are rings represented by the formula (2):

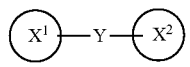
(2)

wherein $X^1$ ring and $X^2$ ring are the same or different, and each is a saturated hydrocarbon ring or an unsaturated hydrocarbon ring; and Y is a bond, a $C_{1-6}$ alkylene group that may be substituted with a $C_{1-4}$ alkyl group, an oxygen atom (—O—), a sulfur atom. (—S—), —SO—, or —SO$_2$—.

Item 3. The epoxy resin composition according to Item 1 or 2, wherein the saturated hydrocarbon ring is a $C_{4-8}$ saturated hydrocarbon ring, and the unsaturated hydrocarbon ring is a $C_{4-8}$ unsaturated hydrocarbon ring.

Item 4. The epoxy resin composition according to Item 1, wherein the composition comprises an acid-modified polyolefin resin and at least one epoxy resin selected from the group consisting of:

an epoxy resin represented by the formula (1-iia):

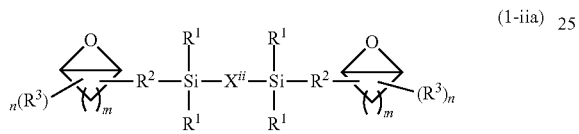
(1-iia)

wherein $X^{ii}$ is a divalent group obtained by removing two hydrogen atoms from a saturated hydrocarbon ring or an unsaturated hydrocarbon ring, or from rings having a structure in which 2 to 6 saturated hydrocarbon rings and/or unsaturated hydrocarbon rings are condensed; or a divalent group represented by the formula (2$^g$-iia):

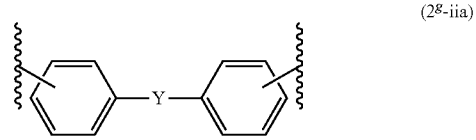
(2$^g$-iia)

wherein Y is a bond, a $C_{1-6}$ alkylene group that may be substituted with a $C_{3-4}$ alkyl group, an oxygen atom (—O—), a sulfur atom (—S—), —SO—, or —SO$_2$—;

$R^1$ is the same or different, and is a $C_{1-18}$ alkyl group, a $C_{2-9}$ alkenyl group, a cycloalkyl group, an aryl group, or an aralkyl group, wherein one or more carbon atoms of these groups may be replaced by at least one atom selected from the group consisting of an oxygen atom and a nitrogen atom;

$R^2$ is the same or different, and is a $C_{1-18}$ alkylene group, wherein one or more carbon atoms of this group other than a carbon atom directly bonded to a silicon atom may be replaced by at least one atom selected from the group consisting of an oxygen atom and a nitrogen atom;

$R^3$ is the same or different, and is a $C_{1-3}$ alkyl group, a $C_{2-9}$ alkenyl group, a cycloalkyl group, an aryl group, or an aralkyl group, wherein one or more carbon atoms of these groups may be replaced by at least one atom selected from the group consisting of an oxygen atom and a nitrogen atom;

m is an integer of 0 to 6; and n is an integer of 0 to 3; and an epoxy resin represented by the formula (1-iiia):

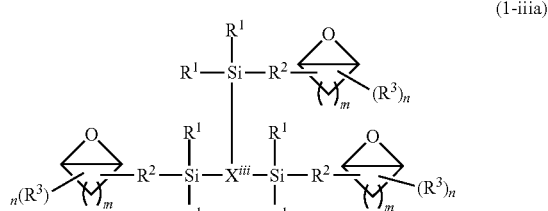
(1-iiia)

wherein $X^{iii}$ is a trivalent group obtained by removing three hydrogen atoms from a saturated hydrocarbon ring or an unsaturated hydrocarbon ring, or from rings having a structure in which 2 to 6 saturated hydrocarbon rings and/or unsaturated hydrocarbon rings are condensed; or a trivalent group represented by the formula (2$^g$-iiia):

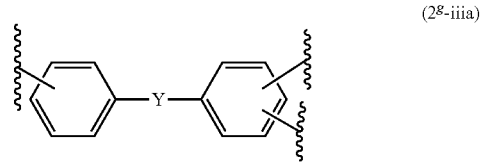
(2$^g$-iiia)

wherein Y is as defined above; and $R^1$, $R^2$, $R^3$, m, and n are as defined above.

Item 5. The epoxy resin composition according to any one of Items 1 to 4, wherein the acid-modified polyolefin resin is at least one member selected from the group consisting of an acid-modified polyolefin resin obtained by grafting a polyolefin resin with an acid-modified group, an acid-modified polyolefin resin obtained by copolymerizing an olefin and at least one of an unsaturated carboxylic acid and/or an acid anhydride thereof, and acid-modified polyolefin resins obtained by hydrogenating these acid-modified polyolefin resins.

Item 6. The epoxy resin composition according to any one of Items 1 to 5, wherein the acid-modified polyolefin resin has an acid value (mgKOH/g) of 0.5 to 500.

Item 7. A varnish comprising the epoxy resin composition according to any one of Items 1 to 6 and an organic solvent.

Item 8. A cured product of the epoxy resin composition according to any one of Items 1 to 6.

Item 9. A semiconductor sealing material, a liquid sealing material, a potting material, a sealing material, an interlayer insulation flint, an adhesive layer, a coverlay an electromagnetic shielding film, a printed circuit board material, or a composite material, each of which uses the epoxy resin composition according to any one of Items 1 to 6, the varnish according to item 7, or the cured product according to Item 8.

Item 10. The epoxy resin composition according to any one of Items 1 to 6, the varnish according to Item 7, or the cured product according to Item 8 for use in a semiconductor sealing material, a liquid sealing material, a potting material, a sealing material, an interlayer insulation film, an adhesive layer, a coverlay film, an electromagnetic shielding film, a printed circuit board material, or a composite material.

Item 11. Use of the epoxy resin composition according to any one of items 1 to 6, the varnish according to item 7, or the cured product according to Item 8 for producing a semiconductor sealing material, a liquid sealing material, a potting material, a sealing material, an interlayer insulation film, an adhesive layer, a coverlay film, an electromagnetic shielding film, a printed circuit board material, or a composite material.

Advantageous Effects of Invention

Because the epoxy resin composition of the present invention comprises an epoxy resin represented by the above formula (1) and an acid-modified polyolefin resin, a cured product thereof has good adhesion and electric characteristics (low dielectric characteristics). Therefore, the epoxy resin composition of the present invention can be suitably used for various applications, such as semiconductor sealing materials, liquid sealing materials, potting materials, sealing materials, interlayer insulation films, adhesive layers, coverlay films, electromagnetic shielding films, printed circuit board materials, and composite materials.

DESCRIPTION OF EMBODIMENTS

Embodiments of the present invention are described in more detail below.

The epoxy resin composition contained in the present invention comprises an epoxy resin and an acid-modified polyolefin resin, the epoxy resin being represented by the formula (1):

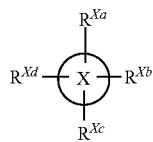

(1)

In the formula (1), $R^{Xa}$, $R^{Xb}$, $R^{Xc}$, and $R^{Xd}$ are the same or different, and each is a hydrogen atom, a lower alkyl group, a lower alkoxy group, a lower alkenyl group, a halogen atom, or a group represented by the formula (3):

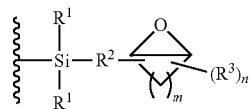

(3)

(hereinafter also referred to as the "group of the formula (3)"). Hereinafter, a lower alkyl group, a lower alkoxy group, and a lower alkenyl group are also collectively referred to as "lower carbon substituents." In the present invention, among the lower carbon substituents, a lower alkyl group or a lower alkoxy group is more preferable.

However, at least one of $R^{Xa}$, $R^{Xb}$, $R^{Xc}$, and $R^{Xd}$ is a group of the formula (3). In other words, three of $R^{Xa}$, $R^{Xb}$, $R^{Xc}$, and $R^{Xd}$ are hydrogen atoms, halogen atoms, or lower carbon substituents, and the other one is a group of the formula (3); two of them are hydrogen atoms, halogen atoms, or lower carbon substituents, and the other two are groups of the formula (3); one of them is a hydrogen atom, a halogen atom, or a lower carbon substituent, and the other three are groups of the formula (3); or all of them are groups of the formula (3). More specifically, for example, $R^{Xa}$, $R^{Xb}$, $R^{Xc}$, and $R^{Xd}$ may be as follows:

(i) $R^{Xa}$, $R^{Xb}$, and $R^{Xc}$ are hydrogen atoms, halogen atoms, or lower carbon substituents, and $R^{Xd}$ is a group of the formula (3);
(ii) $R^{Xa}$ and $R^{Xb}$ are hydrogen atoms, halogen atoms, or lower carbon substituents, and $R^{Xc}$ and $R^{Xd}$ are groups of the formula (3);
(iii) $R^{Xa}$ is a hydrogen atom, a halogen atom, or a lower carbon substituent, and $R^{Xb}$, $R^{Xc}$, and $R^{Xd}$ are groups of the formula (3); or
(iv) all of $R^{Xa}$, $R^{Xb}$, $R^{Xc}$, and $R^{Xd}$ are groups of the formula (3). Of $R^{Xa}$, $R^{Xb}$, $R^{Xc}$, and $R^{Xd}$, one or more members that are not groups of the formula (3) are more preferably hydrogen atoms or lower carbon substituents.

In the formula (1), $R^{Xa}$, $R^{Xb}$, $R^{Xc}$, and $R^{Xd}$ may be the same or different. Therefore, (i) when $R^{Xa}$, $R^{Xb}$, and $R^{Xc}$ are hydrogen atoms, halogen atoms, or lower carbon substituents, and when $R^{Xd}$ is a group of the formula (3), $R^{Xa}$, $R^{Xb}$, and $R^{Xc}$ may be the same or different. (ii) When $R^{Xa}$ and $R^{Xb}$ are hydrogen atoms, halogen atoms, or lower carbon substituents, and when $R^{Xc}$ and $R^{Xd}$ are groups of the formula (3), $R^{Xa}$ and $R^{Xb}$ may be the same or different, and $R^{Xc}$ and $R^{Xd}$ may also be the same or different (iii) When $R^{Xa}$ is a hydrogen atom, a halogen atom, or a lower carbon substituent, and when $R^{Xb}$, $R^{Xc}$, and $R^{Xd}$ are groups of the formula (3), $R^{Xb}$, $R^{Xc}$, and $R^{Xd}$ may be the same or different. (iv) When all of $R^{Xa}$, $R^{Xb}$, $R^{Xc}$, and $R^{Xd}$ are groups of the formula (3), $R^{Xa}$, $R^{Xb}$, $R^{Xc}$, and $R^{Xd}$ may be the same or different. In any of these cases, the groups of the formula (3) are preferably the same.

Moreover, when two or three of $R^{Xa}$, $R^{Xb}$, $R^{Xc}$, and $R^{Xd}$ are halogen atoms or lower carbon substituents, these halogen atoms or lower carbon substituents may also be the same or different. In this case, two or three of $R^{Xa}$, $R^{Xb}$, $R^{Xc}$, and $R^{Xd}$ are more preferably the sane lower carbon substituents.

In the present specification, the lower carbon substituent refers to a lower alkyl group, a lower alkoxy group, or a lower alkenyl group. The term "lower" used herein means 1 to 6 (1, 2, 3, 4, 5, or 6) carbon atoms. Of the lower carbon substituents, a lower alkyl group or a lower alkoxy group is preferable. Specifically, preferable examples of lower alkyl groups include a methyl group, an ethyl group, an n-propyl group, an isopropyl group, an n-butyl group, an isobutyl group, and the like. Preferable examples of lower alkoxy groups include a methoxy group, an ethoxy group, a propoxy group, an isopropoxy group, a butoxy group, an isobutoxy group, and the like.

Moreover, in the present specification, the halogen atom is a fluorine atom, a chlorine atom, a bromine atom, or an iodine atom; preferably a fluorine atom, a chlorine atom, or a bromine atom; and more preferably a fluorine atom or a bromine atom.

In the formula (1), X ring is a saturated hydrocarbon ring or an unsaturated hydrocarbon ring, or rings having a structure in which 2 to 6 saturated hydrocarbon rings and/or unsaturated hydrocarbon rings are condensed, or in which 2 saturated hydrocarbon rings and/or unsaturated hydrocarbon rings are connected. In the present specification, the saturated hydrocarbon ring is, for example, preferably a $C_{4-8}$ (4, 5, 6, 7, or 8) saturated hydrocarbon ring, and particularly preferably a cyclopentane ring, a cyclohexane ring, or the like. In the present specification, the unsaturated hydrocarbon ring is, for example, preferably a $C_{4-8}$ (4, 5, 6, 7, or 8) unsaturated hydrocarbon ring, and particularly preferably a benzene ring or the like. In the present specification, the rings having a structure in which 2 to 6 saturated hydrocarbon rings and/or unsaturated hydrocarbon rings are condensed are preferably 2, 3, or 4 condensed saturated hydrocarbon rings and/or unsaturated hydrocarbon rings, and more preferably 2 or 3 condensed saturated hydrocarbon rings and/or unsaturated hydrocarbon rings. Examples include a decahydronaphthalene ring, an adamantane ring, a naphthalene ring, a phenanthrene ring, an anthracene ring, a pyrene ring, a triphenylene ring, a tetralin ring, 1,2,3,4,5,6,7,8-octahydronaphthalene ring, a norbornene ring, and the like.

In the present specification, a saturated hydrocarbon ring or an unsaturated hydrocarbon ring, or rings having a structure in which 2 to 6 saturated hydrocarbon rings and/or unsaturated hydrocarbon rings are condensed, are also collectively referred to as "hydrocarbon rings."

The rings having a structure in which 2 saturated hydrocarbon rings and/or unsaturated hydrocarbon rings are connected are preferably rings represented by the formula (2)

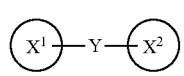

(2)

In the formula (2), $X^1$ ring and $X^2$ ring are the same or different, and each is a saturated hydrocarbon ring or an unsaturated hydrocarbon ring. That is, the $X^1$ ring and $X^2$ ring are both saturated hydrocarbon rings or unsaturated hydrocarbon rings; or one of them is a saturated hydrocarbon ring, and the other is an unsaturated hydrocarbon ring. It is preferable that the $X^1$ ring and the $X^2$ ring be both saturated hydrocarbon rings or unsaturated hydrocarbon rings. For example, it is preferable that the $X^1$ ring and the $X^2$ ring be both benzene rings or cyclohexane rings, or that one of them be a benzene ring and the other be a cyclohexane ring; and it is more preferable that both of them be benzene rings.

Moreover, Y is a bond, a $C_{1-6}$ alkylene group that may be substituted with a $C_{1-4}$ alkyl group, an oxygen atom (—O—), a sulfur atom (—S—), —SO—, or —SO$_2$—, Examples of the $C_{1-6}$ alkylene group include a methylene group, an ethylene group, a trimethylene group, a tetramethylene group, a hexamethylene group, and the like. Moreover, examples of the $C_{1-4}$ alkyl group as a substituent include a methyl group, an ethyl group, an n-propyl group, an isopropyl group, an n-butyl group, an isobutyl group, and the like. Preferable examples of the $C_{1-6}$ alkylene group substituted with a $C_{1-4}$ alkyl group include —CH(CH$_3$)—, —C(CH$_3$)$_2$—, CH$_2$CH(CH$_3$)CH$_2$—, —CH$_2$C(CH$_3$)$_2$CH$_2$—, and the like. Y is preferably a bond, an oxygen atom, a methylene group, a dimethylmethylene group, —S—, or —SO$_2$—; and more preferably a bond, a dimethylmethylene group, an oxygen atom, or —SO$_2$—.

The rings represented by the formula (2) are substituted with $R^{Xa}$, $R^{Xb}$, $R^{Xc}$, and $R^{Xd}$. When the X ring of the formula (1) is rings represented by the formula (2), when three of $R^{Xa}$ to $R^{Xd}$ are hydrogen atoms, halogen atoms, or lower carbon substituents, and when the other one is a group of the formula (3), one of the $X^1$ ring and $X^2$ ring may be substituted with a group of the formula (3). In this case, the rings represented by the formula (2) are substituted with 0, 1, 2, or 3 halogen atoms or lower carbon substituents, and (number of halogen atoms or lower carbon substituents substituted in $X^1$ ring: number of halogen atoms or lower carbon substituents substituted in $X^2$ ring) can be (1:0), (0:1), (2:0), (1:1), (0:2), (3:0), (2:1), (1:2), or (0:3). When two of $R^{Xa}$ to $R^{Xd}$ are hydrogen atoms, halogen atoms, or lower carbon substituents, and when the other two are groups of the formula (3), one of the $X^1$ ring and $X^2$ ring may be substituted with 2 groups of the formula (3), or the $X^1$ ring and the $X^2$ ring each may be substituted with a group of the formula (3). It is preferable that the $X^1$ ring and the $X^2$ ring each be substituted with a group of the formula (3). In this case, the rings represented by the formula (2) are substituted with 0, 1, or 2 halogen atoms or lower carbon substituents, and (number of halogen atoms or lower carbon substituents substituted in $X^1$ ring:number of halogen atoms or lower carbon substituents substituted in $X^2$ ring) can be (1:0), (0:1), (2:0), (1:1), or (0:2). When one of $R^{Xa}$ to $R^{Xd}$ is a hydrogen atom, a halogen atom, or a lower carbon substituent, and when the other three are groups of the formula (3), one of the $X^1$ ring and $X^2$ ring may be substituted with 3 groups of the formula (3); the $X^1$ ring may be substituted with 2 groups of the formula (3), and the $X^2$ ring may be substituted with 1 group of the formula (3); or the $X^1$ ring may be substituted with 1 group of the formula (3), and the $X^2$ ring may be substituted with 2 groups of the formula (3). It is preferable that the $X^1$ ring be substituted with 2 groups of the formula (3), and the $X^2$ ring be substituted with 1 group of the formula (3); or that the $X^1$ ring be substituted with 1 group of the formula (3), and the $X^2$ ring be substituted with 2 groups of the formula (3). In this case, the rings represented by the formula (2) are substituted with 0 or 1 halogen atom or lower carbon substituent, and (number of halogen atoms or lower carbon substituents substituted in $X^1$ ring:number of halogen atoms or lower carbon substituents substituted in $X^2$ ring) may be (1:0) or (0:1). When all of $R^{Xa}$ to $R^{Xd}$ are groups of the formula (3), one of the $X^1$ ring and the $X^2$ ring may be substituted with 4 groups of the formula (3); the $X^1$ ring may be substituted with 3 groups of the formula (3), and the $X^2$ ring may be substituted with 1 group of the formula (3); the $X^1$ ring may be substituted with 1 group of the formula (3), and the $X^2$ ring may be substituted with 3 groups of the formula (3); or the $X^1$ ring may be substituted with 2 groups of the formula (3), and the $X^2$ ring may be substituted with 2 groups of the formula (3). It is preferable that the $X^1$ ring be substituted with 2 groups of the formula (3), and the $X^2$ ring be substituted with 2 groups of the formula (3).

As a group of the formula (1), a tetravalent group represented by the formula (1'):

(1')

wherein in the formula (1'), X ring is as defined above; is particularly preferably a group represented by the following' formula. Specifically, the group is represented by the following formula:

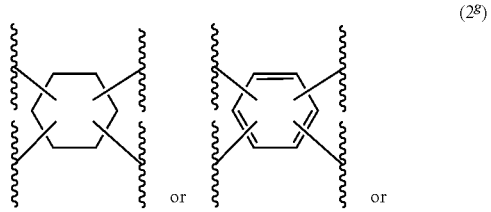

(2$^g$)

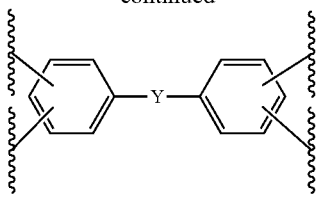

wherein in the formula (2ᵍ), Y is as defined above.

In the formula (3), $R^1$ is the same or different, and is a $C^{1-18}$ alkyl group, a $C_{2-9}$ alkenyl group, a cycloalkyl group, an aryl group, or an aralkyl group, wherein one or more carbon atoms of these groups may be replaced by at least one atom selected from the group consisting of an oxygen atom and a nitrogen atom (preferably an oxygen atom). The one or more carbon atoms are preferably carbon atoms that are not directly bonded to the silicon atom. The one or more carbon atoms that may be replaced are one or plural (e.q., 2, 3, 4, 5, or 6) carbon atoms, and preferably one carbon atom. In terms of ease of synthesis etc., it is preferable that $R^1$ bonded to the same silicon atom be the same. It is more preferable that all $R^1$ present in the formula (1) be the same.

The $C_{1-18}$ alkyl group represented by $R^1$ is, for example, a linear or branched alkyl group. Examples include a methyl group, an ethyl group, an n-propyl group, an isopropyl group, an n-butyl group, an isobutyl group, a tert-butyl group, an n-pentyl group, neopentyl group, a tert-pentyl group, an n-hexyl group, an n-heptyl group, a 2,2,4-trimethylpentyl group, an n-octyl group, an isooctyl group, an n-nonyl group, an n-decyl group, an n-dodecyl group, and the like. Preferable is a $C_{1-10}$ alkyl group, more preferable is a $C_{1-6}$ alkyl group, even more preferable is a $C_{1-3}$ alkyl group, and particularly preferable is a methyl group.

The $C_{2-9}$ alkenyl group represented by $R^1$ is, for example, a linear or branched alkenyl group. Examples include a vinyl group, an allyl group, a 2-propenyl group, a butenyl group, a pentenyl group, a hexenyl group, a heptenyl group, an octenyl group, a nonenyl group, and the like. Preferable is a $C_{2-4}$ alkenyl group.

The cycloalkyl group represented by $R^1$ is, for example, a 3- to 8-membered ring cycloalkyl group. Examples include a cyclopentyl group, a cyclohexyl group, a cycloheptyl group, a methylcyclohexyl group, and the like.

The aryl group represented by $R^1$ is, for example, a monocyclic or bicyclic aryl group. Examples include a phenyl group, a tolyl group, a xylyl group, an ethyl phenyl group, a naphthyl group, and the like. Preferable is a phenyl group.

The aralkyl group represented by $R^1$ is, for example, a $C_{1-4}$ alkyl group substituted with an aryl group (particularly a phenyl group). Examples include a benzyl group, an α-phenethyl group, a β-phenethyl group, a β-methylphenethyl group, and the like.

$R^1$ is preferably a $C_{1-3}$ alkyl group, and more preferably a methyl group.

In the formula (3), $R^2$ is a $C_{1-18}$ alkylene group. The alkylene group is a linear or branched alkylene group, and preferably a linear alkylene group. Examples include a methylene group, a methylmethylene group, an ethylmethylene group, a dimethylmethylene group, a diethylmethylene group, a dimethylene group ($—CH_2CH_2—$), a trimethylene group ($—CH_2CH_2CH_2—$), a tetramethylene group, a pentamethylene group, a hexamethylene group, a heptamethylene group, an octamethylene group, a nonamethylene group, a decamethylene group, an undecamethylene group, a dodecamethylene group, a tridecamethylene group, and the like. Specific examples include a $C_{2-18}$ alkylene group, preferably a $C_{2-10}$ alkylene group, more preferably a $C_{2-8}$ alkylene group, even more preferably a $C_{2-6}$ alkylene group, and particularly preferably a $C_{2-5}$ alkylene group.

One or more carbon atoms of the $C_{1-18}$ alkylene group may be replaced by at least one atom selected from the group consisting of an oxygen atom and a nitrogen atom (preferably an oxygen atom). The one or more carbon atoms are preferably carbon atoms that are not directly bonded to the silicon atom, and the 3- to 8-membered ring or epoxy ring. Moreover, the one or more carbon atoms that may be replaced are one or plural (e.g., 2, 3, 4, 5, or 6) carbon atoms, and preferably one carbon atom.

When the side of $R^2$ binding to the silicon atom is expressed as (*), examples of this group include (*)—$C_{2-9}$alkylene-O—$C_{1-8}$alkylene-, preferably (*)—$C_{2-4}$ alkylene-O—$C_{1-3}$ alkylene-, more preferably (*)—$C_{2-4}$ alkylene-O—$C_{1-2}$ alkylene-, and particularly preferably (*)—$C_3$ alkylene-O-methylene-.

Specific examples include (*)-$(CH_2)_2$—O—$CH_2$—, (*)-$(CH_2)_3$—O—$CH_2$—, (*)-$(CH_2)_3$—O—$(CH_2)_2$—, (*)-$(CH_2)_5$—O—$(CH_2)_4$—, and the like; of these, (*)-$(CH_2)_3$—O—$CH_2$ is preferable.

In the formula (3), m is an integer of 0 to 6 (i.e., 0, 1, 2, 3, 4, 5, or 6). Moreover, n is an integer of 0 to 3 (i.e., 0, 1, 2, or 3). The group bonded to R of the formula (3) (on the side not binding to the silicon atom) is represented by the formula (4) (hereafter also referred to as "the group of the formula (4)"), as shown below.

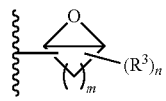

(4)

The group of the formula (4) wherein m is an integer of 1 to 6 is specifically described by the following structural formulas.

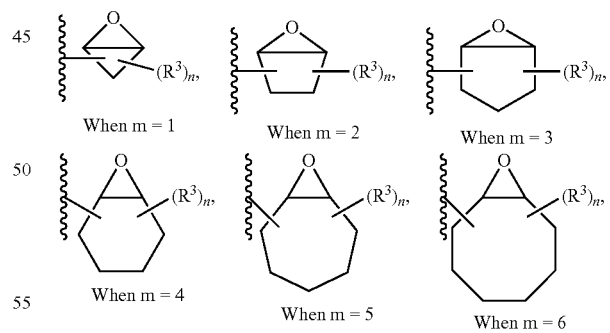

When m is 0, only an epoxy ring remains, and n is an integer of 0 to 3; thus, the group of the formula (4) is a group represented by any of the following formulas:

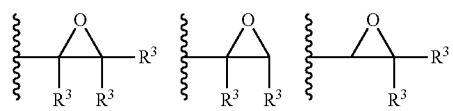

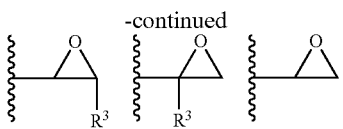

In the formula (3), $R^2$ and $R^3$ bind to a 3- to 8-membered ring or an epoxy ring. n represents the number of $R^3$ binding to the 3- to 8-membered ring or the epoxy ring.

In the formula (3), $R^3$ is the same or different, and is a $C_{1-18}$ alkyl group, a $C_{2-9}$ alkenyl group, a cycloalkyl group, an aryl group, or an aralkyl group. One or more carbon atoms of these groups may be replaced by at least one atom selected from the group consisting of an oxygen atom and a nitrogen atom. The one or more carbon atoms are preferably carbon atoms that are not directly bonded to the 3- to 8-membered ring or epoxy ring. Moreover, the one or more carbon atoms that may be replaced can be one or plural (e.g., 2, 3, 4, 5, or 6) carbon atoms, and preferably one carbon atom.

Examples of the $C_{1-18}$ alkyl group, $C_{2-9}$ alkenyl group, cycloalkyl group, aryl group, and aralkyl group represented by $R^3$ include the same corresponding substituents represented by $R^1$ described above.

$R^3$ is preferably a $C_{1-3}$ alkyl group, and more preferably a methyl group or an ethyl group.

Preferable examples of the group of the formula (3) include groups wherein $R^1$, $R^2$, $R^3$, m, and n are as defined above; all $R^1$ are the same; and all $R^3$ are the same (when there are plural $R^3$). The number of this group present in the epoxy resin represented by the formula (1) is 1, 2, 3, or 4; and they may be the same or different, and are preferably the same.

Particularly preferable specific examples of the group of the formula (4) include groups wherein. $R^3$ is as defined above; m is 0, 1, 2, 3, or 4; and n is 0, 1, or 2. More preferable among these are the following groups (all $R^3$ are as defined above):

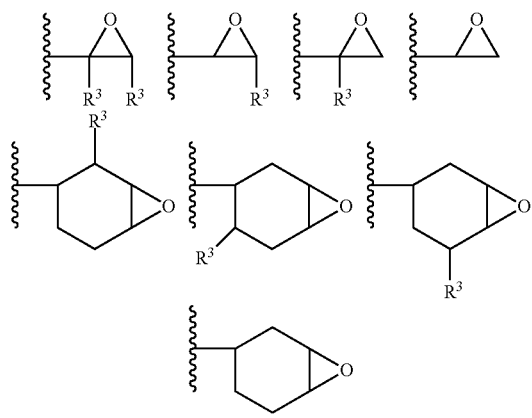

The number of groups of the formula (4) present in the epoxy resin represented by the formula. (1) is 1, 2, 3, or 4; and they may be the same or different, and are preferably the same.

Moreover, one or more hydrogen atoms bonded to one or more carbon atoms that constitute the hydrocarbon ring constituting the X ring, and that are not bonded to $R^{Xa}$, $R^{Xb}$, $R^{Xc}$, and $R^{Xd}$, may be replaced by a lower carbon substituent or a halogen at (preferably a lower carbon substituent). That is, when the X ring is a saturated hydrocarbon ring or an unsaturated hydrocarbon ring, or rings having a structure in which 2 to 6 saturated hydrocarbon rings and/or unsaturated hydrocarbon rings are condensed, one or more hydrogen atoms bonded to one or more carbon atoms that: constitute these lings, and that are not bonded to $R^{Xa}$, $R^{Xb}$, $R^{Xc}$, or $R^{Xd}$, may be replaced by a lower carbon substituent or a halogen atom (preferably a lower carbon substituent). When the X ring is rings having a structure in which 2 saturated hydrocarbon rings and/or unsaturated hydrocarbon rings are connected, one or more hydrogen atoms bonded to one or more carbon atoms that constitute theses connected saturated hydrocarbon rings and/or unsaturated hydrocarbon rings, and that are not bonded to $R^{Xa}$, $R^{Xb}$, $R^{Xc}$, or $R^{Xd}$, may be replaced by a lower carbon substituent or a halogen atom (preferably a lower carbon substituent). When the case in which the X ring is rings represented by the formula (2) is explained in detail, one or more hydrogen atoms bonded to one or more carbon atoms that constitute the $X^1$ ring and $X^2$ ring, and that are not bonded to $R^{Xa}$, $R^{Xb}$, $R^{Xc}$, or $R^{Xd}$, may be replaced by a lower carbon substituent or a halogen atom (preferably a lower carbon substituent).

In the present specification, carbon atoms that constitute the hydrocarbon ring constituting the X ring, and that are not bonded to $R^{Xa}$, $R^{Xb}$, $R^{Xc}$, and $R^{Xd}$, are also referred to as "$R^{Xa-d}$ non-binding carbon atoms."

The lower carbon substituent or halogen atom that may replace one or more hydrogen atoms bonded to one or more $R^{Xa-d}$ non-binding carbon atoms is preferably singly bonded to one $R^{Xa-d}$ non-binding carbon atom. That is, when hydrogen atoms bonded to $R^{Xa-d}$ non-binding carbon atoms are replaced, only one of the hydrogen atoms bonded to the $R^{Xa-d}$ non-binding carbon atoms is preferably replaced by a lower carbon substituent or halogen atom. Moreover, the number of substituents (i.e., the total number of lower carbon substituents and halogen atoms) is more preferably less than the number of $R^{Xa-d}$ non-binding carbon atoms. More specifically, the number of substituents is preferably 1 to 6 (1, 2, 3, 4, 5, or 6), more preferably 1 to 4, and even more preferably 1 or 2. Particularly when the X ring is rings represented by the formula (2), one or more hydrogen atoms to be replaced are preferably hydrogen atoms bonded to carbon atoms that are not bonded to Y.

When at least one of $R^{Xa}$, $R^{Xb}$, $R^{Xc}$, and $R^{Xd}$ is a lower carbon substituent, and when at least one lower carbon substituent is bonded to an $R^{Xa-d}$ non-binding carbon atom, all of the lower carbon substituents are preferably the same. That is, when there are lower carbon substituents among $R^{Xa}$, $R^{Xb}$, $R^{Xc}$, and $R^{Xd}$, and when there are lower carbon substituents bonded to $R^{a-d}$ non-binding carbon atoms, all of the lower carbon substituents are preferably the same. Moreover, although it is not particularly limited, when at least one of $R^{Xa}$, $R^{Xb}$, $R^{Xc}$, and $R^{Xd}$ is a halogen atom, and when at least one halogen atom is bonded to an $R^{Xa-d}$ non-binding carbon atom, all of the halogen atoms are preferably the same. That is, when there are halogen atoms among $R^{Xa}$, $R^{Xb}$, $R^{Xc}$, and $R^{Xd}$, and when there are halogen atoms bonded to $R^{Xa-d}$ non-binding carbon atoms, all of the halogen atoms are preferably the same.

More specifically, for example, when the tetravalent group represented by the above formula (1') is the following:

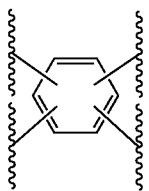

preferable examples of the epoxy resin represented by the formula (1) include an epoxy resin represented by the formula (1-X1):

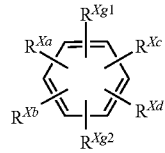

(1-X1)

wherein in the formula (1-X1), $R^{Xa}$, $R^{Xb}$, $R^{Xc}$, and $R^{Xd}$ are as defined above; and $R^{Xg1}$ and $R^{Xg2}$ are the same or different, and each is a hydrogen atom, a lower alkyl group, a lower alkoxy group, or a lower alkenyl group.

In the formula (1-X1), $R^{Xa}$, $R^{Xb}$, $R^{Xc}$, $R^{Xd}$, $R^{Xg1}$, and $R^{Xg2}$ are more preferably each bonded to a different carbon atom on the benzene ring. Among the epoxy resins represented by the formula (1-X1), one wherein $R^{Xg1}$ and $R^{Xg2}$ are hydrogen atoms is preferable.

More preferable examples of the epoxy resin represented by the formula (1-X1) include:
an epoxy resin represented by the formula (1-X1a):

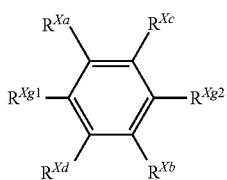

(1-X1a)

wherein in the formula (1-X1a), $R^{Xa}$, $R^{Xb}$, $R^{Xc}$, and $R^{Xd}$ are as defined above; and $R^{Xg1}$ and $R^{Xg2}$ are as defined above; and an epoxy resin represented by the formula (1-X1b):

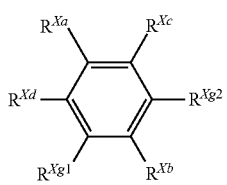

(1-X1b)

wherein in the formula 1-X1b, $R^{Xa}$, $R^{Xb}$, $R^{Xc}$, and $R^{Xd}$ are as defined above; and $R^{Xg1}$ and $R^{Xg2}$ are as defined above.

More preferable among the epoxy resins represented by the formula (1-X1a) are, for example, those wherein $R^{Xa}$ and $R^{Xb}$ are hydrogen atoms, $R^{Xc}$ and $R^{Xd}$ are groups of the formula. (3), and $R^{Xg1}$ and $R^{Xg2}$ are hydrogen atoms; and those wherein $R^{Xa}$ and $R^{Xc}$ are hydrogen atoms, $R^{Xb}$ and $R^{Xd}$ are groups of the formula (3), and $R^{Xg1}$ and $R^{Xg2}$ are hydrogen atoms.

More preferable among the epoxy resins represented by the formula (1-X1b) are, for example, those wherein $R^{Xa}$ is a hydrogen atom, $R^{Xb}$, $R^{Xc}$, and $R^{Xd}$ are groups of the formula (3), and $R^{Xg1}$ and $R^{Xg2}$ are hydrogen atoms.

Moreover, when the tetravalent group represented by the above formula. (1') is a group represented by the following formula:

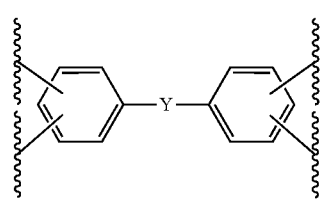

(2$^g$)

wherein in the formula a (2$^g$), Y is as defined above; preferable examples of the epoxy resin represented by the formula (1) also include an epoxy resin represented by the formula (1-X2):

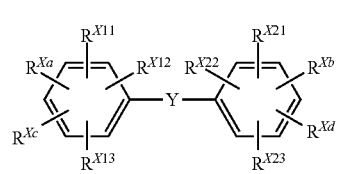

(1-X2)

wherein in the formula (1-X2), Y is as defined above; $R^{Xa}$, $R^{Xb}$, $R^{Xc}$, and $R^{Xd}$ are as defined above; and $R^{X11}$, $R^{X12}$, and $R^{X13}$, as well as $R^{X21}$, $R^{X22}$, and $R^{X23}$ are the same or different, and each is a hydrogen atom, a lower alkyl group, a lower alkoxy group, or a lower alkenyl group.

In the formula (1-X2), $R^{Xa}$, $R^{Xc}$, $R^{X11}$, $R^{X12}$, and $R^{X13}$ preferably each bind to a different carbon atom; and $R^{Xb}$, $R^{Xd}$, $R^{X21}$, $R^{X22}$, and $R^{X23}$ more preferably each bind to a different carbon atom. None of $R^{Xa}$, $R^{Xb}$, $R^{Xc}$, $R^{Xd}$, $R^{X11}$, $R^{X12}$, $R^{X13}$, $R^{X21}$, $R^{X22}$, and $R^{X23}$ binds to a carbon atom bonded to Y.

More preferable among the epoxy resins represented by the formula (1-X2) are:
an epoxy resin represented by the formula (1-X2a):

(1-X2a)

wherein in the formula (1-X2a), Y is as defined above; $R^{Xa}$, $R^{Xb}$, $R^{Xc}$, and $R^{Xd}$ are as defined above; and $R^{X11}$, $R^{X12}$, and $R^{X13}$, as well as $R^{X21}$, $R^{X22}$, and $R^{X23}$ are the same or different, and each is a hydrogen atom, a lower alkyl group, a lower alkoxy group, or a lower alkenyl group;

an epoxy resin represented by the formula (1-X2b):

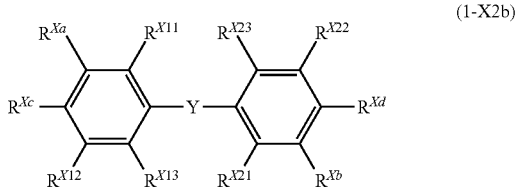

(1-X2b)

wherein in the formula (1-X2b), Y is as defined above; $R^{Xa}$, $R^{Xb}$, $R^{Xc}$, and $R^{Xd}$ are as defined above; and $R^{X11}$, $R^{X12}$, and $R^{X13}$, as well as $R^{X21}$, $R^{X22}$, and $R^{X23}$ are the same or different, and each is a hydrogen atom, a lower alkyl group, a lower alkoxy group, or a lower alkenyl group; and an epoxy resin represented by the formula (1-X2c):

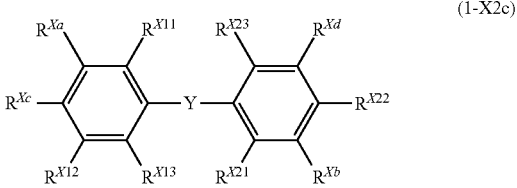

(1-X2c)

wherein the formula (1-X2c), Y is as defined above; $R^{Xa}$, $R^{Xb}$, $R^{Xc}$, and $R^{Xd}$ are as defined above; and $R^{X11}$, $R^{X12}$, and $R^{X13}$, as well as $R^{X21}$, $R^{X22}$, and $R^{X23}$ are the same or different, and each is a hydrogen atom, a lower alkyl group, a lower alkoxy group, or a lower alkenyl group.

More preferable among the epoxy resins represented by the formula (1-X2a) are, for example, those wherein $R^{Xa}$, $R^{Xb}$, $R^{Xc}$, and $R^{Xd}$ are groups of the formula (3); $R^{X11}$ and $R^{X21}$ are lower carbon substituents; and $R^{X12}$, $R^{X13}$, $R^{X22}$, and $R^{X23}$ are hydrogen atoms. Particularly preferable are those wherein. Y is a $C_{1-6}$ alkylene group that may be substituted with a. $C_{1-4}$ alkyl group (particularly —C(CH$_3$)$_2$—); $R^{Xa}$, $R^{Xb}$, $R^{Xc}$, and $R^{Xd}$ are groups of the formula (3); $R^{X11}$ and $R^{X21}$ are lower alkoxy groups; and $R^{X12}$, $R^{X13}$, $R^{X22}$, and are hydrogen atoms in these cases, it is more preferable that all of the groups of the formula (3) as $R^{Xa}$, $R^{Xb}$, $R^{Xc}$, and $R^{Xd}$ be the same, and that the lower carbon substituents as $R^{X11}$ and $R^{X21}$ be the same.

Preferable among the epoxy resins represented by the formula (1-X2b) are, for example, those wherein $R^{Xa}$ and $R^{Xb}$ are hydrogen atoms; $R^{Xc}$ and $R^{Xd}$ are groups of the formula (3); and $R^{X11}$, $R^{X12}$, $R^{X13}$, $R^{X21}$ $R^{X22}$, and $R^{X23}$ are hydrogen atoms. In this case, it is more preferable that the groups of the formula (3) as $R^{Xc}$ and $R^{Xd}$ be the same.

Preferable among the epoxy resins represented by the formula (1-X2c) are, for example, those wherein $R^{Xa}$ is a hydrogen atom; $R^{Xb}$, $R^{Xc}$, and $R^{Xd}$ are groups of the formula. (3); and $R^{X11}$, $R^{X12}$, $R^{X13}$, $R^{21}$, $R^{X22}$, and $R^{X23}$ are hydrogen atoms. In this case, it is more preferable that the groups of the formula (3) as $R^{Xb}$, $R^{Xc}$, and $R^{Xd}$ be the same.

In the present specification, the explanations relating to the X ring, $R^{Xa}$, $R^{Xb}$, $R^{Xc}$, and $R^{Xd}$ in the formula (1), and $R^1$, $R^2$, $R^3$, m, and n in the group of the formula (3), including the explanation about the group of the formula (4), can be combined in any way. Any epoxy resins represented by combinations thereof can be also used in the present invention.

The formula (1) can satisfy any of the following:
(iia) one or more hydrogen atoms bonded to one or more $R^{Xa-d}$ non-binding carbon atoms are not replaced; $R^{Xa}$ and $R^{Xb}$ of $R^{Xa}$, $R^{Xb}$, $R^{Xc}$, and $R^{Xd}$ are hydrogen atoms; and $R^{Xc}$ and $R^{Xd}$ are groups of the formula (3);
(iiia) one or more hydrogen atoms bonded to one or more $R^{Xa-d}$ non-binding carbon atoms are not replaced; $R^{Xa}$ of $R^{Xa}$, $R^{Xb}$, $R^{Xc}$, and $R^{Xd}$ is a hydrogen atom; and $R^{Xb}$, $R^{Xc}$, and $R^{Xd}$ are groups of the formula (3); or
(iva) one or more hydrogen atoms bonded to one or more $R^{Xa-d}$ non-binding carbon atoms are not replaced; and all of $R^{Xa}$, $R^{Xb}$, $R^{Xc}$, and $R^{Xd}$ are groups of the formula (3).

In the case of (iia), preferable examples of the epoxy resin represented by the formula (1) include an epoxy resin represented by the following formula (1-iia):

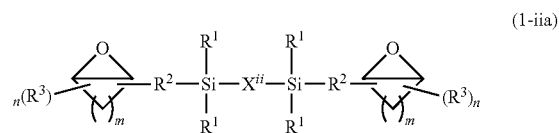

(1-iia)

wherein $X^{ii}$ is a divalent group obtained by removing two hydrogen atoms from a hydrocarbon ring, or a divalent group represented by the formula ($2^g$-iia):

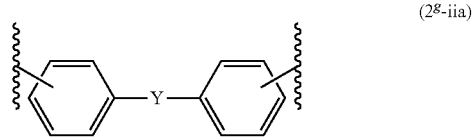

($2^g$-iia)

wherein Y is as defined above; and
$R^1$, $R^2$, $R^3$, m, and n are as defined above.
$R^1$, $R^2$, $R^1$, m, and n each may be the same or different, and are preferably the same.

The divalent group represented by $X^{ii}$ is preferably a cyclohexane-1,4-diyl group or a 1,4-phenylene group; and more preferably a 1,4-phenylene group.

Preferable among the divalent groups represented by the formula ($2^g$-iia) is a group represented by the formula ($2^g$-iia'):

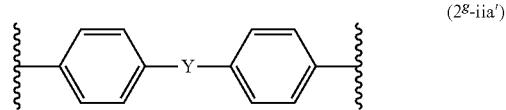

($2^g$-iia')

wherein Y is as defined above.
In the formula (2 iia'), Y is preferably a bond, a dimethylmethylene group, an oxygen atom, or —SO$_2$—.
$X^{ii}$ is preferably a cyclohexane-1,4-diyl group, a 1,4-phenylene group, or a group of the formula ($2^g$-iia'); and more preferably a 1,4-phenylene group.

The present invention can more preferably use, for example, an epoxy resin represented by the formula (1-iia), wherein m is the same and is 0, 1, 2, 3, or 4 (particularly preferably m is the same and is 0 or 4); n is the same and is 0 (that is, the ring is not substituted with $R^3$); $X^{ii}$ is a divalent group obtained by removing two hydrogen atoms from a hydrocarbon ring (particularly preferably a benzene ring);

$R^1$ is the same and is a $C_{1-3}$ alkyl group; and $R^2$ is the same and is a $C_{2-6}$ alkylene group, wherein one carbon atom that is not directly bonded to the silicon atom, and the 3- to 6-membered ring or epoxy ring may be replaced by an oxygen atom.

In the case of (iiia), the epoxy resins represented by the formula (1) preferably include an epoxy resin represented by the following formula (1-iiia):

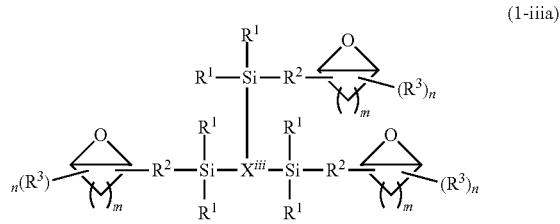

(1-iiia)

wherein $X^{iii}$ is a trivalent group obtained by removing three hydrogen atoms from a hydrocarbon ring, or a trivalent group represented by the formula ($2^g$-iiia):

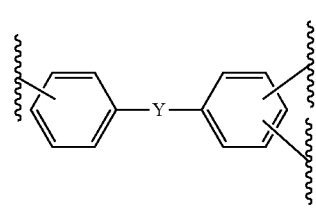

($2^g$-iiia)

wherein Y is as defined above; and
$R^1$, $R^2$, $R^3$, m, and n are as defined above.
$R^1$, $R^2$, $R^3$, m, and n each may be the same or different, and are preferably the same.

Preferable examples of the trivalent group represented by $X^{iii}$ include the following groups:

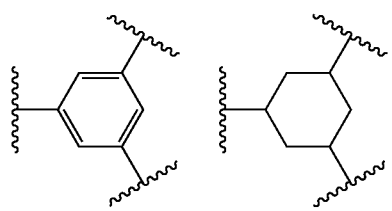 [SMILES: *c1cc(*)cc(*)c1 ; *C1CC(*)CC(*)C1]

Preferable among the trivalent groups represented by the formula ($2^g$-iiia) include a group represented by the formula ($2^g$-iiia'):

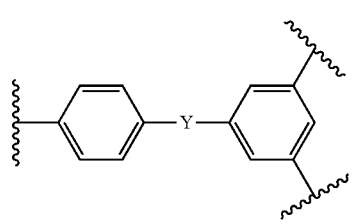

($2^g$-iiia')

wherein Y is as defined above.

In the formula ($2^g$-iiia'), Y is particularly preferably a bond, a diethyl ethylene group, an oxygen atom, or —$SO_2$—.

The present invention can more preferably use, for example, an epoxy resin represented by the formula (1-iiia), wherein m is the same and is 0, 1, 2, 3, or 4 (particularly preferably m is the same and is 0 or 4); n is the same and is 0 (that is, the ring is not substituted with $R^3$); $X^{iii}$ is a trivalent group obtained by removing three hydrogen atoms from a hydrocarbon ring (particularly preferably a benzene ring); $R^1$ is the same and is a $C_{1-3}$ alkyl group; and R is the same and is a $C_{2-6}$ alkylene group, wherein one carbon atom that is not directly bonded to the silicon atom and the 3- to 6-membered ring or epoxy ring may be replaced by an oxygen atom.

In the case of (iva), the epoxy resins represented by the formula (1) include an epoxy resin represented by the following formula (1-iva):

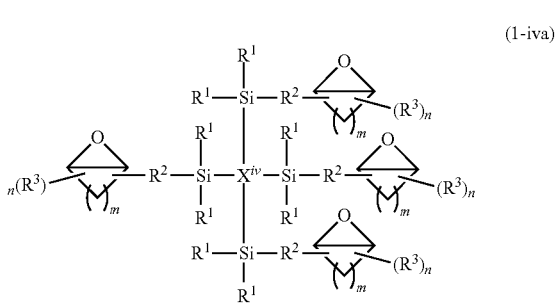

(1-iva)

wherein $X^{iv}$ is a tetravalent group represented by the above formula (1'), wherein one or more hydrogen atoms bonded to one or more $R^{Xa-d}$ non-binding carbon atoms in the X ring are not replaced; and $R^1$, $R^2$, $R^3$, m, and n are as defined above.

$R^1$, $R^2$, $R^3$, m, and n each may be the same or different, and are preferably the same.

Preferable examples of the tetravalent group represented by $X^{iv}$ include the following groups:

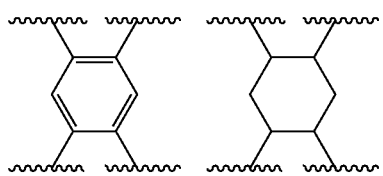 [SMILES: *c1cc(*)c(*)cc1* ; *C1CC(*)C(*)CC1*]

As the tetravalent group represented by $X^{iv}$, among tetravalent groups represented by the formula (2), wherein one or more hydrogen atoms bonded to one or more $R^{Xa-d}$ non-binding carbon atoms are not replaced, preferable is a group represented by the formula ($2^g$-iva'):

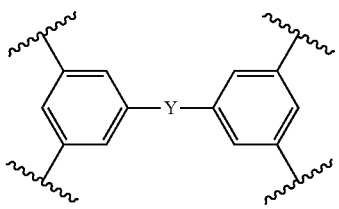

(2$^g$-iva')

wherein Y is as defined above.

In the formula (2$^g$-iva'), Y is particularly preferably a bond, a dimethylmethylene group, an oxygen atom, or —SO$_2$—.

The present invention can more preferably use, for example, an epoxy resin represented by the formula (1-iva), wherein m is the same and is 0, 1, 2, 3, or 4 (particularly preferably m is the same and is 0 or 4); n is the same and is 0 (that is, the ring is not substituted with R$^3$); X$^{iv}$ is a tetravalent group obtained by removing four hydrogen atoms from a hydrocarbon ring (particularly preferably a benzene ring) R$^2$ is the same and is a C$_{1-3}$ alkyl group; and R$^2$ is the same and is a C$_{2-6}$ alkylene group, wherein one carbon atom that is not directly bonded to the silicon atom and the 3- to 6-membered ring or epoxy ring may be replaced by an oxygen atom.

More preferable among the epoxy resins represented by the formula (1) are specifically, for example, compounds represented by the formula (1-IIa):

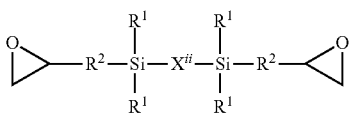

(1-IIa)

wherein R$^1$, R$^2$, and X$^{ii}$ are as defined above.

Preferable among the compounds represented by the formula (1-IIa) are compounds wherein X$^{ii}$ is a 1,4-phenylene group or a group represented by the formula (2$^g$-iia') (preferably a 1,4-phenylene group); R$^1$ is the same or different (preferably the same), and is a C$_{1-3}$ alkyl group particularly a methyl group); and R$^2$ is the same or different (preferably the same), and is a C$_{2-6}$ alkylene group, (*)-(CH$_2$)$_2$—O—CH$_2$—, (*)-(CH$_2$)$_3$—O—CH$_2$—, (*)-(CH$_2$)$_3$—O—(CH$_2$)$_2$—, or (*)-(CH$_2$)$_5$—O—(CH$_2$)$_4$—. (*) represents the side of R$^2$ binding to the silicon atom, as described above.

More preferable among the epoxy resins represented by the above formula (1-IIa) is:

an epoxy resin represented by the formula (1-IIa1):

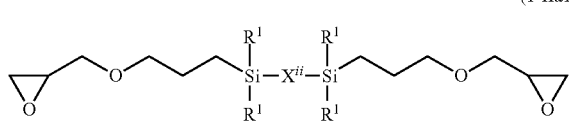

(1-IIa1)

wherein R$^1$ and X$^{ii}$ are as defined above; or an epoxy resin represented by the formula (1-IIa2):

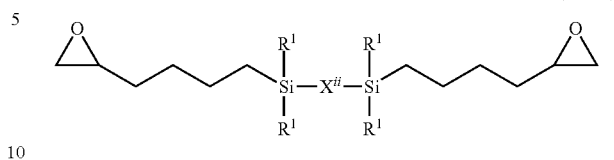

(1-IIa2)

wherein R$^1$ and X$^{ii}$ are as defined above.

R$^1$ may be the same or different, and is preferably the same.

More preferably, in the formula (1-IIa1) or (1-IIa2). R$^1$ is the same or different (preferably the same), and is a C$_{1-3}$ alkyl group (particularly a methyl group); and X$^{ii}$ is a 1,4-phenylene group or a group represented by the formula (2$^g$-iia'), More preferable among the epoxy resins represented by the formula (1) include an epoxy resin represented by the formula (1-IIb):

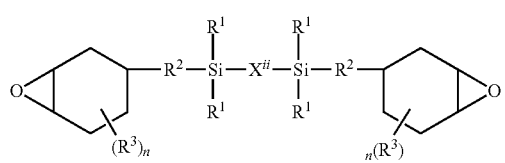

(1-IIb)

wherein R$^1$, R$^2$, R$^3$, X$^{ii}$, and n are as defined above.

R$^1$, R$^2$, R$^3$, and n each may be the same or different, and are preferably the same.

More preferably, in the formula (1-IIb), X$^{ii}$ is a 1,4-phenylene group or a group represented by the formula (2$^g$-iia') (preferably a 1,4-phenylene group); is the same or different (preferably the same), and is a C$_{1-3}$ alkyl group (particularly a methyl group); both n is 0 (that is, the ring is not substituted with R$^3$); and R$^2$ is the same or different (preferably the same), and is a C$_{2-6}$ alkylene group (preferably a dimethylene group: —(CH$_2$)$_2$—).

More preferable among the epoxy resins represented by the formula (1) is an epoxy resin represented by the formula (1-IIIa):

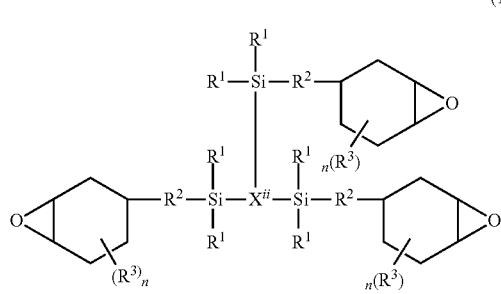

(1-IIIa)

wherein R$^1$, R$^2$, R$^3$, X$^{iii}$, and n are as defined above.

R$^1$, R$^2$, R$^3$, and n each may be the same or different, and are preferably the same.

More preferably, in the formula (1-IIIa), $X^{iii}$ is

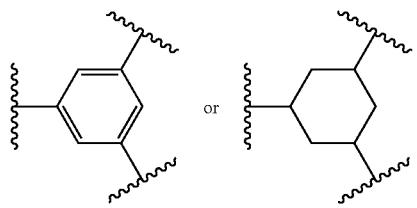 [SMILES: *c1cc(*)cc(*)c1 ; *C1CC(*)CC(*)C1]

or a group represented by the formula ($2^g$-iiia'); is the same or different (preferably the same), and is a $C_{1-3}$ alkyl group (particularly a methyl group); both n is 0 (that is, the ring is not substituted with $R^3$); and $R^2$ is the same or different (preferably the same), and is a $C_{2-6}$ alkylene group (preferably a dimethylene group: —$(CH_2)_2$—).

In the epoxy resin composition of the present invention, the epoxy resins represented by the formula (1) can be used singly or in combination of two or more.

The epoxy resin represented by the formula (1) can be produced by or according to a known method, for example, based on or according to the disclosure of PTL 2 (GB1123960B). Moreover, the epoxy resin represented by the formula (1-iia) can be produced by, for example, a reaction represented by the following reaction formula:

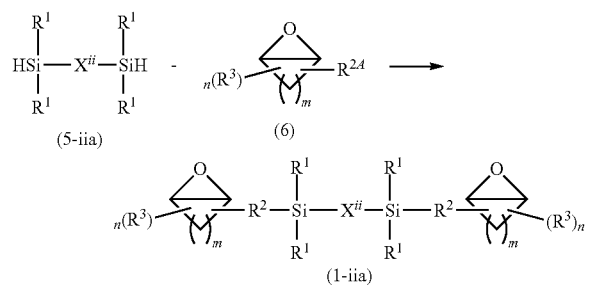

wherein $R^{2A}$ is a $C_{2-18}$ alkenyl group, wherein one or more carbon atoms of this group may be replaced by at least one atom selected from the group consisting of an oxygen atom and a nitrogen atom; and $R^1$, $R^2$, $R^3$, and $X^{ii}$ are as defined above.

The $C_{2-18}$ alkenyl group represented by $R^{2A}$ is a linear or branched alkenyl group, and preferably a linear alkenyl group. Specific examples include a vinyl group, an allyl group, a propenyl group, a butenyl group, a pentenyl group, a hexenyl group, a heptenyl group, an octenyl group, a norbornenyl group, a cyclohexenyl group, and the like. A $C_{2-10}$ alkenyl group is preferable; a $C_{2-8}$ alkenyl group is more preferable; a $C_{2-6}$ alkenyl group is even more preferable; and a vinyl group, an allyl group, or a butenyl group is particularly preferable. The alkenyl group is preferably an α-alkenyl group.

One or more carbon atoms of these $C_{2-18}$ alkylene groups may be replaced by at least one atom selected from the group consisting of an oxygen atom and a nitrogen atom (preferably an oxygen atom). The one or more carbon atoms are preferably carbon atoms that are not directly bonded to the epoxy ring. Moreover, the one or more carbon atoms that may be replaced are one or plural. (e.g., 2, 3, 4, 5, or 6 carbon atoms, and preferably one carbon atom. Examples of this group include $C_{2-9}$ alkenyl-O—$C_{1-8}$ alkylene-, preferably $C_{2-4}$ alkenyl—O—$C_{1-3}$ alkylene-, more preferably $C_{2-4}$ alkenyl—O—$C_{1-2}$ alkylene-, and particularly preferably $C_3$ alkenyl-O—$CH_2$—. Specific examples include $CH_2$=CH—O—$CH_2$—, $CH_2$=CH—CH—O—$CH_2$—, $CH_2$=CH—$OH_2$—O—$(CH_2)_2$—, $CH_2$=CH—$(CH_2)_3$—O—$(CH_2)_4$—, and the like; among these, $CH_2$=CH—$CH_2$—O—$CH_2$-(allyloxymethyl group) is preferable.

The epoxy resin represented by the formula (1-iia) can be produced by hydrosilylation of the compound represented by the formula (5-iia) and the compound represented by the formula (6).

Hydrosilylation can be generally performed in the presence of a catalyst in the presence or absence of a solvent. Moreover, when a compound represented by the formula (5-iiia):

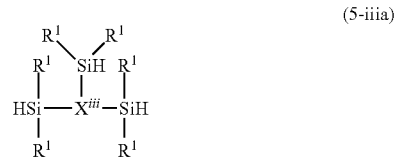

wherein $R^1$ and $X^{iii}$ are as defined above; or the formula (5-iva):

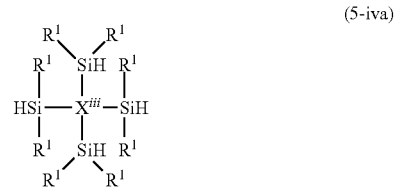

wherein $R^1$ and are as defined above; or the formula (5-ia):

wherein $X^1$ is a monovalent group obtained by removing one hydrogen atom from a hydrocarbon ring, and $R^1$ is as defined above; is used in place of the compound represented by the formula (5-iia), an epoxy resin represented by the above formula (1-iiia) or (1-iva), or an epoxy resin having a structure in which one group of the formula (3) is bonded to a hydrocarbon ring can also be produced. Moreover, various compounds represented by the formula (1) can be produced by using compounds having a structure in which $X^i$ to $X^{iv}$ are each replaced by a monovalent group obtained by removing one hydrogen atom from the X ring, a divalent group obtained by removing two hydrogen atoms from the X ring, a trivalent group obtained by removing three hydrogen atoms from the X ring, or a tetravalent group obtained by removing four hydrogen atoms from the X ring.

The catalyst used in hydrosilylation may be a known catalyst. Examples include platinum-based catalysts, such as platinum carbon, chloroplatinic acid, olefin complexes of platinum, alkenylsiloxane complexes of platinum, and carbonyl complexes of platinum; rhodium-based catalysts, such as tris(triphenylphosphine)rhodium; and iridium-based catalysts, such as bis(cyclooctadienyl)dichloroiridium. These catalysts may be in the form of solvates (e.g., hydrates, alcoholates, etc.). Further, the catalyst may be used in the form of a solution obtained by dissolving the catalyst in an alcohol (e.g., ethanol) when used. These catalysts can be used singly or in combination of two or more.

The amount of the catalyst used may be an effective amount as the catalyst. For example, the amount of the catalyst used is generally 0.00001 to 20 parts by mass, and preferably 0.0005 to 5 parts by mass, based on the total amount of 100 parts by mass of the compound represented the formula (5-ia), (5-iia), (5-iiia), or (5-iva), and the compound represented by the formula (6).

Although hydrosilylation proceeds without use of a solvent, the reaction can be carried out under milder conditions by using a solvent. Examples of solvents include aromatic hydrocarbon solvents, such as toluene and xylene; aliphatic hydrocarbon solvents, such as hexane and octane; ether solvents, such as tetrahydrofuran and dioxane; alcohol solvents, such as ethanol and isopropanol; and the like. These may be used singly or in combination of two or more.

The amount of the compound represented by the formula. (6) is, for example, generally 0.5 to 2 mol, preferably 0.6 to 1.5 mol, and more preferably 0.8 to 1.2 mol, per mol of the Si—H group in the compound represented by the formula (5-ia), (5-iia), (5-iiia), or (5-iva).

The reaction temperature is generally 0° C. to 150° C., and preferably 10° C. to 120° C. The reaction time is generally about 1 hour to 24 hours.

After completion of the reaction, the solvent is distilled off from the reaction mixture, or a known isolation method is used, thereby obtaining an epoxy resin represented by the formula (1).

The acid-modified polyolefin resin contained in the epoxy resin composition of the present invention is not particularly limited, as long as it is a polyolefin resin modified with an acid-modified group, such as a carboxyl group or an acid anhydride group.

Specific preferable examples of the acid-modified polyolefin resin include an acid-modified polyolefin resin obtained by grafting a polyolefin resin with an acid-modified group an acid-modified group-grafted acid-modified polyolefin resin), an acid-modified polyolefin resin obtained by copolymerizing an olefin and at least one member selected from the group consisting of an unsaturated carboxylic acid and an acid anhydride thereof (an acid-modified group-copolymerized acid-modified polyolefin resin, i.e., an acid-modified polyolefin resin copolymerized with an acid-modified group), acid-modified polyolefin resins obtained by further hydrogenating these acid-modified polyolefin resins (a hydrogenated acid-modified group-grafted acid-modified polyolefin resin and a hydrogenated acid-modified group-copolymerized acid-modified polyolefin resin), and the like. It is more preferable that the acid-modified group-grafted acid-modified polyolefin resin and the acid-modified polyolefin resin copolymerized with an acid-modified group do not have an unsaturated bond in their main chain.

In general, acid-modified polyolefin resins often refer to acid-modified group-grafted acid-modified polyolefin resins; however, in the present specification, all of the resins mentioned above are included.

Preferable examples of the polyolefin resin in the acid-modified polyolefin resin grafted with an acid-modified group include polyethylene, polypropylene, and an olefin copolymer.

Examples of olefin copolymers include propylene-α-olefin copolymers, olefin-cyclic olefin copolymers, olefin-styrene copolymers, and the like.

Propylene-α-olefin copolymers are obtained by copolymerization of propylene and α-olefins. Examples of α-olefins include ethylene, 1-butene, 1-heptene, 1-octene, 4-methyl-1-pentene, and the like. These α-olefins can be used singly or in combination of two or more. Further, other monomers, such as vinyl acetate, may be combined and copolymerized.

Examples of olefin-cyclic olefin copolymers include copolymers of ethylene or propylene, and tetracyclododecene, and the like.

Examples of olefin-styrene copolymers include a styrene-butadiene copolymer, a styrene-ethylene propylene copolymer, a styrene-butadiene-styrene copolymer, a styrene-isoprene-styrene copolymer, a styrene-ethylene butylene-styrene copolymer, a styrene-ethylene propylene-styrene copolymer, and the like.

As the method for producing the acid-modified polyolefin resin grafted with an acid-modified group, a known method can be used. For example, radical graft reaction of polyolefin resins can be used. More specifically, a radical species is generated in a polymer serving as a main chain using, for example, a radical generator, and unsaturated carboxylic acid and/or unsaturated carboxylic anhydride are graft-polymerized using the radical species as a polymerization starting point.

Examples of the unsaturated carboxylic acid and/or unsaturated carboxylic anhydride include unsaturated monocarboxylic acids, such as acrylic acid, butanoic acid, crotonic acid, vinylacetic acid, methacrylic acid, pentenoic acid, dodecenoic acid, linoleic acid, angelic acid, and cinnamic acid; unsaturated dicarboxylic acids, such as maleic acid, fumarc acid, chloromaleic acid, and himic acid; unsaturated carboxylic anhydrides, such as maleic anhydride, himic anhydride, and acrylic anhydride; and the like. Among these, maleic anhydride can be particularly suitably used.

Preferable radical generators are organic peroxides and azo compounds. Examples of radical generators include peroxides, such as di-tort-butylperoxy phthalate, tert-butyl-hydroperoxide, dicumyl peroxide, benzoyl peroxide, tert-butylperoxy benzoate, tert-butylperoxy-2-ethylhexanoate, tert-butylperoxy pivalate, methyl ethyl ketone peroxide, di-tert-butyl peroxide, and lauroyl peroxide; azo compounds, such as azobisisobutyronitrile, azobisisopropionitrile, and dimethyl 2,2'-azobisisobutyrate; and the like.

Examples of the grafted acid-modified group in the acid-modified polyolefin resin grafted with an acid-modified group include saturated or unsaturated carboxylic acid groups or saturated or unsaturated carboxylic anhydride groups corresponding to the unsaturated carboxylic acids and/or unsaturated carboxylic anhydrides mentioned above. Particularly preferable among these is a group represented by the following formula (maleic anhydride group):

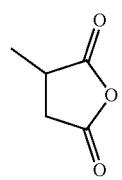

Examples of commercial products of acid-modified polyolefin resins grafted with an acid-modified group, wherein the polyolefin resin is polyethylene, polypropylene, or a propylene-α-olefin copolymer, include Surflen (produced by Mitsubishi Chemical Corporation), Auroren (produced by Nippon Paper industries Co., Ltd.), ACumist (produced by Honeywell, Inc.), Timex (produced by Sanyo Chemical Industries, Ltd.), Adder (produced by Mitsui Chemicals, Inc.), and the like.

Examples of commercial products of acid-modified polyolefin resins grafted with an acid-modified group, wherein the polyolefin resin is an olefin-styrene copolymer, include the Tuftec M series (produced by Asah.i Kasei Corporation), FG1901 (produced by Kraton), and the like.

Examples of the acid-modified polyolefin resin copolymerized with an acid-modified group include those obtained by copolymerization of olefin-based monomers and at least one member selected from the group consisting of unsaturated carboxylic acids and acid anhydrides thereof. Examples of olefin-based monomers include ethylene and propylene, as well as α-olefins, cyclic olefins, etc., mentioned above. Examples of unsaturated carboxylic acids and acid anhydrides thereof include unsaturated monocarboxylic acids, such as acrylic acid, butanoic acid, crotonic acid, vinylacetic acid, methacrylic pentenoic acid, dodecenoic acid, linoleic acid, angelic acid, and cinnamic acid; unsaturated dicarboxylic acids, such as maleic acid, fumaric acid, chloromaleic acid, and himic acid; unsaturated carboxylic anhydrides, such as maleic anhydride, himic anhydride, and acrylic anhydride; and the like. Among these, maleic anhydride can be particularly suitably used. Moreover, in the present invention, the acid-modified polyolefin resin copolymerized with an acid-modified group also includes a copolymer obtained by copolymerization of styrene and at least one member selected from the group consisting of an unsaturated carboxylic acid and an acid anhydride thereof.

Specific preferable examples of the acid-modified polyolefin resin copolymerized with an acid-modified group include acid-modified group-copolymerized acid-modified polyolefin resins that do not have an unsaturated bond in their main chain, such as a styrene-maleic anhydride copolymer, an ethylene-maleic anhydride copolymer, a propylene-maleic anhydride copolymer, and an isobutylene-maleic anhydride copolymer.

Examples of commercial products of the acid-modified polyolefin resin copolymerized with an acid-modified group include the SMA series (produced by Cray Valley), the A-C series (produced by Honeywell, Inc.), Isobam (produced by Kuraray Co., Ltd.), and the like.

Preferable among these in terms of thermal stability and dielectric characteristics are a resin having a structure in which a polyolefin resin that does not have an unsaturated bond is grafted with an acid-modified group, a resin having a structure in which a hydrogenated polyolefin resin is grafted with an acid-modified group, a hydrogenated acid-modified group-grafted acid-modified polyolefin resin, an acid-modified group-copolymerized acid-modified polyolefin resin that does not have an unsaturated bond in its main chain, and a hydrogenated acid-modified group-copolymerized acid-modified polyolefin resin.

The weight average molecular weight of the acid-modified pollyolefin resin is preferably 2000 to 300000, and more preferably 3000 to 200000. Moreover, when the weight average molecular weight of the acid-modified polyolefin resin is 20000 or less, the equivalent ratio of epoxy groups in the epoxy resin represented by the formula (1) to acid-modified groups in the acid-modified polyolefin resin (epoxy groups/acid-modified groups) in the epoxy resin composition of the present invention is preferably about 0.1 to 10, and more preferably about 0.5 to 6, in terms of heat resistance. The lower limit is more preferably 0.5, and even more preferably 0.8. The upper limit is more preferably 6, and even more preferably 3. The weight average molecular weight of the acid-modified polyolefin resin of the present invention is a value measured by gel permeation chromatography (standard substance:polyetyrene).

The acid value (mgKOH/g) of the acid-modified polyolefin resin is preferably 0.5 to 500, and more preferably 2 to 300. Because the acid value is 0.5 or more, compatibility with the epoxy resin is sufficient, and heat resistance is further improved.

Moreover, the functional group equivalent (g/mol) of the acid-modified group of the acid-modified polyolefin resin is preferably 100 to 120000, and more preferably 200 to 30000. If the functional group equivalent exceeds 120000, compatibility with the epoxy resin is not sufficient, and heat resistance and dielectric characteristics may be inferior.

The mixing ratio of the acid-modified polyolefin resin in the epoxy resin composition of the present invention is such that the mixing ratio of the epoxy resin represented by the formula (1) to the acid-modified polyolefin resin is, by mass ratio, preferably 99:1 to 1:99, more preferably 97:3 to 3:97, even more preferably 95:5 to 3:97, and particularly preferably 80:20 to 5:95.

In the epoxy resin composition of the present invention, the acid-modified polyolefin resins can be used singly or in combination of two or more.

The epoxy resin composition of the present invention may contain an epoxy resin other than the epoxy resin represented by the formula (1) within a range that does not impair the effects of the present invention. Examples of other epoxy resins include, but are not limited to, bisphenol A epoxy resins, bisphenol F epoxy resins, phenol novolak epoxy resins, cresol novolak epoxy resins, cycloaliphatic epoxy resins, brominated epoxy resins, triglycidyl isocyanurate, hydrogenated bisphenol A epoxy resins, aliphatic epoxy resins, glycidyl ether epoxy resins, bisphenol S epoxy resins, biphenyl epoxy resins, dicyclo epoxy resins, naphthalene epoxy resins, and the like. These epoxy resins may be used singly or in combination of two or more.

When an epoxy resin other than the epoxy resin represented by the formula (1) is mixed, the mixing ratio of the epoxy resin represented by the formula (1) to the epoxy resin other than the epoxy resin represented by the formula (1) is, by mass ratio, for example, 100:0 to 20:80, preferably 100:0 to 30:70, and more preferably 100:0 to 40:60.

The epoxy resin composition of the present invention may contain, if necessary, fillers, curing agents, curing catalysts, thermoplastic resins, additives, etc., within a range that does not impair the objects and effects of the present invention.

The above fillers can be used singly or in combination of two or more, in consideration of flowability, heat resistance, low thermal expansion properties, mechanical characteristics, hardness, scratch resistance, adhesion, etc., which are required for compositions and cured products.

Examples of fillers include inorganic compounds, such as silica (specifically crystalline silica, fused silica, spherical fused silica, etc.), titanium oxide, zirconium oxide, zinc oxide, tin oxide, silicon nitride, silicon carbide, boron nitride, calcium carbonate, calcium silicate, potassium titanate, aluminum nitride, indium oxide, alumina, antimony oxide, cerium oxide, magnesium oxide, iron oxide, and tin-doped indium oxide (ITO). Other examples include metals, such as gold, silver, copper, aluminum, nickel, iron, zinc, and stainless steel. Still other examples include minerals, such as montmorillonite, talc, mica, boehmite, kaolin, smectite, zonolite, vermiculite, and sericite. Examples of other fillers include carbon compounds, such as carbon black, acetylene black, Ketchen black, and carbon nanotubes; metal hydroxides, such as aluminum hydroxide and magnesium hydroxide; various types of glass, such as glass beads, glass flakes, and glass balloons; and the like. The filler may be used in a powder form, or may be used after being dispersed in a resin.

Examples of curing agents include amine-based curing agents, amide-based curing agents, acid anhydride-based curing agents, phenol-based curing agents, mercaptan-based curing agents, isocyanate-based curing agents, active ester-based curing agents, cyanate ester-based curing agents, and the like. The curing agents may be used singly, or in combination of two or more because they can be properly used corresponding to the required characteristics.

Examples of amine-based curing agents include chain aliphatic amines, such as ethylenediamine, diethylenetriamine, triethylenetetramine, and tetraethylenepentamine; alicyclic amines, such as isophoronediamine, benzenediamine, bis(4-aminocyclohexyl)methane, bis(aminomethyl)cyclohexane, and diaminodicyclohexylmethane; aromatic amines, such as metaphenylenediamine, diaminodiphenylmethane, diethyltoluenediamine, and diaminodiethyldiphenylmethane; secondary and tertiary amines, such as benzyldimethylamine, triethylenediamine, piperidine, 2-(dimethylaminomethyl)phenol, 2,4,6-tris(dimethylaminomethyl)phenol, DBU (1,8-diazabicyclo(5,4,0)-undecene-7), DBN (1,5-diazabicyclo(4,3,0)-nonene-5), and the like.

Examples of amide-based curing agents include dicyandiamide and derivatives thereof, polyimide resins (e.g., polyaminoamide), and the like.

Examples of acid anhydride-based curing agents include aliphatic acid anhydrides, such as maleic anhydride and dodecenylsuccinic anhydride; aromatic acid anhydrides, such as phthalic anhydride, trimellitic anhydride, and pyromellitic dianhydride; alicyclic acid anhydrides, such as methylnadic anhydride, tetrahydrophthalic anhydride, methyltetrahydrophthalic anhydride, hexahydrophthalic anhydride, and 4-methylhexahydrophthalic anhydride; and the like.

Examples of phenol-based curing agents include phenol novolak resins, cresol novolak resins, biphenyl-type novolak resins, triphenylmethane-type phenol resins, naphthol novolak resins, phenol biphenylene resins, phenol aralkyl resins, biphenylaralkyl phenol resins, modified polyphenylene ether resins, compounds having a benzoxazine ring, and the like.

Examples of mercaptan-based curing agents include trimethylolpropane tris(3-mercaptopropionate), tris-[(3-mercaptopropionyloxy)-ethyl]-isocyanurate, pentaerythritol tetrakis(3-mercaptopropionate), tetraethyleneglycol bis(3-mercaptopropionate), pentaerythritol tetrakis(3-mercaptobutyrate), 1,4-bis(3-mercaptobutyryloxy)butane, trimethylolpropane tris(3-mercaptobutyrate), trimethylolethane tris(3-mercaptobutyrate), polysulfide polymers, and the like.

Examples of isocyanate-based curing agents include hexamethylene diisocyanate, 1,4-tetramethylene diisocyanate, 2-methylpentane-1,5-diisocyanate, lysine diisocyanate, isophorone diisocyanate, norbornane diisocyanate, and the like.

Examples of active ester-based curing agents include compounds having, per molecule, one or more ester groups reactive with epoxy resins. Specific examples include phenol esters, thiophenol esters, N-hydroxyamine esters, heterocyclic ring hydroxy compound esters, and the like.

When an acid anhydride-based curing agent is used as a curing agent, the acid-modified group in the equivalent ratio of epoxy groups in the epoxy resin of the present invention to acid-modified groups in the acid-modified polyolefin resin (epoxy groups/acid-modified groups) is the sum of the acid-modified groups in the acid-modified polyolefin resin and the acid anhydride groups in the acid anhydride-based curing agent.

Examples of curing catalysts include imidazole compounds, dicyandiamide, tertiary amine, phosphorus-based compounds, Lewis acid compounds, cationic initiators, and the like. The curing catalysts may be used singly or in combination with the above curing agents.

Examples of thermoplastic resins include acrylic resins, phenoxy resins, polyamide resins, polyester resins, polycarbonate resins, polyphenylene ether resins, polyurethane resins, polyarylate resins, polyacetal resins, and the like. In terms of compatibility with the epoxy resin composition of the present invention and heat resistance, acrylic resins, phenoxy resins, polyphenylene ether resins, and polyarylate resins are preferable; and more preferable among these are polyphenylene ether resins.

Examples of additives include antioxidants, inorganic fluorescent substances, lubricants, ultraviolet absorbers, heat light stabilizers, antistatic agents, polymerization inhibitors, antifoaming agents, solvents, anti-aging agents, radical inhibitors, adhesion-improving agents, flame retardants, surfactants, storage stability-improving agents, ozone aging inhibitors, thickeners, plasticizers, radiation-blocking agents, nucleating agents, coupling agents, conductivity-imparting agents, phosphorus-based peroxide-decomposing agents, pigments, metal deactivators, physical property-controlling agents, and the like.

The epoxy resin composition of the present invention can be produced by mixing the epoxy resin represented by the formula (1) and an acid-modified polyolefin resin, and further optionally other components. The mixing method is not particularly limited, as long as it allows uniform mixing.

The epoxy resin composition of the present invention may contain a solvent (e.g., toluene, xylene, methyl ethyl ketone, acetone, cyclohexanone, methylcyclohexane, or cyclohexane) within a range that does not adversely affect the effects of the present invention. The epoxy resin composition can be dissolved in such a solvent to prepare a varnish. Further, the varnish can be used to obtain a cured product of a desired shape. For example, a film-like cured product can be obtained by applying the varnish to a substrate (e.g., copper foil, aluminum foil, polyimide film, etc.), followed by heating.

A cured product can be obtained by curing the epoxy resin composition of the present invention (i.e., a cured product of the epoxy resin composition). As the curing method, for example, the composition can be cured by heating. The curing temperature is generally room temperature to 250° C. The curing time varies depending on the composition, and can be generally widely set from 30 minutes to 1 week.

A cured product obtained by curing the epoxy resin composition of the present invention has excellent electric characteristics and high adhesive strength to metal. Accordingly, the epoxy resin composition of the present invention can be preferably used for various applications, such as semiconductor sealing materials, liquid sealing materials, potting materials, sealing materials, interlayer insulation films, adhesive layers, overlay films, electromagnetic shielding films, printed circuit board materials, and composite materials.

In the present specification, the term "comprising" includes "consisting essentially of" and "consisting of."

EXAMPLES

The present invention is described in more detail below with reference to Examples; however, the present invention is not limited to only these Examples.

PRODUCTION EXAMPLE 1 (PRODUCTION OF EPOXY RESIN A)

Allyl glycidyl ether (5.9 g), 0.05 g of 2 wt % ethanol solution of hexachloroplatinic acid hexahydrate, and 100 g of toluene were placed in a 200-mL four-necked flask equipped with a stirrer, a thermometer, and a condenser in a nitrogen atmosphere, and the liquid temperature was raised to 70° C. Thereafter, 5.0 g of 1,4-bis(dimethylsilyl)benzene was added dropwise for 15 minutes, and the mixture was then stirred at 90° C. for 4 hours. After the toluene was removed by concentration, 10.3 g (epoxy equivalent: 211 g/eq) of 1,4-bis[(2,3-epoxypropyloxypropyl)dimethylsilyl]benzene (epoxy resin A) was obtained as a colorless, transparent liquid.

PRODUCTION EXAMPLE 2 (PRODUCTION OF EPOXY RESIN B)

1,2-Epoxy-5-hexene (5.0 g), 0.05 g of 2 wt % ethanol solution of hexachloroplatinic acid hexahydrate, and 100 g of toluene were placed in a 200-mL four-necked flask equipped with a stirrer, a thermometer, and a condenser in a nitrogen atmosphere, and the liquid temperature was raised to 70° C. Thereafter, 5.0 g of 1,4-bis(dimethylsilyl)benzene was added dropwise for 15 minutes, and the mixture was then stirred at 90° C. for 5 hours. After the toluene was removed by concentration, 9.5 g (epoxy equivalent: 195 g/eq) of 1,4-bis[(2,3-epoxybutyl)dimethylsilyl]benzene (epoxy resin B) was obtained as a colorless, transparent liquid.

PRODUCTION EXAMPLE 3 (PRODUCTION OF EPOXY RESIN C)

1,2-Epoxy-4-vinylcyclohexane (6.4 g), 0.05 g of 2 wt % ethanol solution of hexachloroplatinic acid hexahydrate, and 100 g of toluene were placed in a 200-mL four-necked flask equipped with a stirrer, a thermometer, and a condenser in a nitrogen atmosphere, and the liquid temperature was raised to 70° C. Thereafter, 5.0 g of 1,4-bis(dimethylsilyl)benzene was added dropwise for 15 minutes, and the mixture was then stirred at 90° C. for 4 hours. After the toluene was removed by concentration, 10.8 g (epoxy equivalent: 221 g/eq) of 1,4-bis{[2-(3,4-epoxycyclohexyl)ethyl]dimethylsilyl}benzene (epoxy resin C) was obtained as a colorless, transparent liquid.

PRODUCTION EXAMPLE 4 (PRODUCTION OF EPOXY RESIN D)

1,2-Epoxy-4-vinylcyclohexane (4.3 g), 0.05 g of 2 wt % ethanol solution of hexachloroplatinic acid hexahydrate, and 250 g of toluene were placed in a 200-mL four-necked flask equipped with a stirrer, a thermometer, and a condenser in a nitrogen atmosphere, and the liquid temperature was raised to 70° C. Thereafter, 5.0 g of bis[(p-dimethylsilyl)phenyl] ether was added dropwise for 15 minutes, and the mixture was then stirred at 90° C. for 6 hours. After the toluene was removed by concentration, 8.9 g (epoxy equivalent: 267 g/eq) of 4,4'-bis{[2-(3,4-epoxycyclohexyl)ethyl]dimethylsilyl} diphenyl ether (epoxy resin D) was obtained as a colorless, transparent liquid.

PRODUCTION EXAMPLE 5 (PRODUCTION OF EPOXY RESIN E)

1,2-Epoxy-4-vinylcyclohexane (7.4 g), 0.05 q of 2 wt % ethanol solution of hexachloroplatinic acid hexahydrate, and 250 g of toluene were placed in a 200-mL four-necked flask equipped with a stirrer, a thermometer, and a condenser in a nitrogen atmosphere, and the liquid temperature was raised to 70° C. Thereafter, 5.0 g of 1,3,5-tris(dimethylsilyl)benzene was added dropwise for 15 minutes, and the mixture was then stirred at 90° C. for 6 hours. After the toluene was removed by concentration, 11.8 g (epoxy equivalent: 208 g/eq) of 1,3,5-tris([2-(3,4-epoxycyclohexyl)ethyl]dimethylsilyl]benzene (epoxy resin. F) was obtained as a colorless, transparent liquid.

EXAMPLES AND COMPARATIVE EXAMPLES

Components in amounts (mass ratio) shown in Tables 1 and 2 were weighed in a cup and stirred with a magnetic stirrer at room temperature (25° C.) for 5 minutes, thereby preparing epoxy resin compositions. Toluene (40 parts by mass) was added to 10 parts by mass of each of the prepared epoxy resin compositions, and the mixture was stirred with a magnetic stirrer at room temperature (25° C.) for 5 minutes, thereby preparing varnishes.

The components in Tables 1 and 2 are as follows. The numerical value of each component in Tables 1 and 2 represents part by mass.

Epoxy resin F: Bis-A epoxy resin (Grade 828), produced by Mitsubishi Chemical Corporation (epoxy equivalent: 189 g/eq)

Epoxy resin G: cycloaliphatic epoxy resin, produced by Daicel Corporation (Celloxide 2021P; general name: 3',4'-epoxycyclohexylmethyl 3,4-epoxycyclohexanecarboxylate) (epoxy equivalent: 137 g/eq)

Acid-modified polyolefin resin A: Tuftec M1913, produced by Asahi Kasei Corporation (maleic anhydride-modified polyolefin resin (more specifically, hydrogenated SEBS (styrene-ethylene-butylene-styrene copolymer) grafted with a maleic anhydride group; acid value: about 10 mgKOH/g)

Acid-modified polyolefin resin. B: Auroren 100S, produced by Nippon Paper Industries Co., Ltd. (acid-modified non-chlorine-based polyolefin resin grafted with an acid-modified group)

Acid-modified polyolefin resin C: SMA-3000, produced by Cray Valley (acid-modified polyolefin resin copolymerized with an acid-modified group (more specifically, a copolymer of styrene and maleic anhydride), 285 mgKOH/q)

Other component A: cationic polymerization initiator (SAN-AID SI-150L, produced by Sanshin Chemical Industry Co., Ltd.)

Other component B: acid anhydride-based curing agent (MH-700, produced by New Japan Chemical Co., Ltd.)

Other component C: imidazole-based curing catalyst (EMI24, produced by Mitsubishi Chemical Corporation)

Other component D: polyphenylene ether resin (SA-90, produced by SABIC)

TEST EXAMPLE (1) 180-Degree Peel Strength against Copper Foil after Moisture Absorption Test The varnishes obtained in the Examples and the Comparative Examples were each applied to a 35-μm-thick polyimide film, and dried by heating at 120° C. for 5 minutes, thereby obtaining polyimide films with resin. A 35-μm-thick electrolytic copper foil (produced by Furukawa Electric Co., Ltd.) was superimposed thereon, and the resulting products were cured by heating with a heat press at 170° C. at 3 MPa for 30 minutes, thereby obtaining laminated films. Further, the laminated films were treated at 85° C. at 85 RH % (relative humidity: 85%) for 72 hours. After treatment, cuts with a width of 1 cm were made with a cutter, thereby preparing 180-degree peel strength test pieces. The obtained test pieces were each subjected to a 180-degree peel strength test by vertically pulling the copper foil and polyimide at 180 degrees using AGS-X (produced by Shimadzu Corp.) at a test rate of 50 mm/min. Tables 1 and 2 show the results.

(2) Electric Characteristics after Moisture Absorption Test (Relative Dielectric Constant and Dielectric Loss Tangent)

The varnishes obtained in the Examples and the Comparative Examples were each applied to a mold-release-treated PET film, and dried by heating at 120° C. for 5 minutes, thereby obtaining uncured films. Further, the uncured films were cured by heating at 150° C. for 2 hours, thereby obtaining cured films having a film thickness of 200 μm. The cured films were treated at 85° C. at 85 RH % for 72 hours, thereby preparing test pieces for dielectric measurement.

The relative dielectric constant (1 GHz) and the dielectric loss tangent (1 GHz) of each of the obtained test pieces were measured using a dielectric constant measuring device (Impedance Analyzer, produced by Agilent) at 25° C. The dielectric constant measuring device was calibrated with PTFE. Tables 1 and 2 show the results.

TABLE 2

| | | Comparative Example | | | | |
|---|---|---|---|---|---|---|
| | | 1 | 2 | 3 | 4 | 5 |
| Epoxy resin | F | 10 | 10 | | 10 | 100 |
| | G | | | 10 | | |
| Acid-modified polyolefin resin | A | 150 | 40 | 150 | | |
| | B | | | | 150 | |
| | C | | | | | 80 |
| Other components | A | | | 0.1 | | |
| | B | 7 | 7 | | 7 | |
| | C | 0.1 | 0.1 | | 0.1 | 1 |
| Copper foil peel strength after moisture absorption test (N/cm) | | 4.5 | 4.2 | 3.2 | 4.6 | 3.0 |
| Relative dielectric constant after moisture absorption test (1 GHz) | | 2.8 | 3.0 | 2.9 | 2.9 | 2.7 |
| Dielectric loss tangent after moisture absorption test (1 GHz) | | 0.008 | 0.013 | 0.015 | 0.009 | 0.010 |

The invention claimed is:

1. An epoxy resin composition comprising an epoxy resin and an acid-modified polyolefin resin, the epoxy resin being at least one epoxy resin selected from the group consisting of:

an epoxy resin represented by the formula (1-iia):

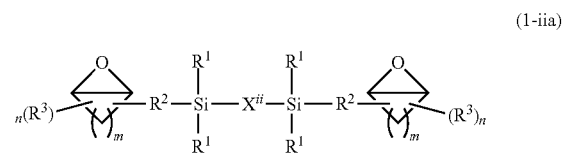

(1-iia)

wherein $X^{ii}$ is a divalent group obtained by removing two hydrogen atoms from a saturated hydrocarbon ring or an unsaturated hydrocarbon ring, or from rings having

TABLE 1

| | | Example | | | | | | | | |
|---|---|---|---|---|---|---|---|---|---|---|
| | | 1 | 2 | 3 | 4 | 5 | 6 | 7 | 8 | 9 |
| Epoxy resin | A | 10 | | | | | | | | |
| | B | | 10 | | | | | | | |
| | C | | | 10 | 10 | 10 | 10 | 100 | | |
| | D | | | | | | | | 10 | |
| | E | | | | | | | | | 10 |
| Acid-modified polyolefin resin | A | 140 | 140 | 150 | 40 | 90 | | | 150 | |
| | B | | | | | | 100 | | | 150 |
| | C | | | | | | | 80 | | |
| Other components | A | | | | | 0.2 | | | | |
| | B | 7 | 7 | 7 | 7 | 7 | | | 6 | 7 |
| | C | 0.1 | 0.1 | 0.1 | 0.1 | 0.1 | | 1 | 0.01 | 0.01 |
| | D | | | | | 90 | | | | |
| Copper foil peel strength after moisture absorption test (N/cm) | | 8.5 | 8.2 | 7.5 | 8.5 | 7.2 | 7.0 | 6.5 | 7.5 | 7.0 |
| Relative dielectric constant after moisture absorption test (1 GHz) | | 2.4 | 2.4 | 2.4 | 2.4 | 2.3 | 2.4 | 2.4 | 2.4 | 2.4 |
| Dielectric loss tangent after moisture absorption test (1 GHz) | | 0.002 | 0.002 | 0.002 | 0.002 | 0.002 | 0.002 | 0.003 | 0.002 | 0.002 | a structure in which 2 to 6 saturated hydrocarbon rings and/or unsaturated hydrocarbon rings are condensed; or a divalent group represented by the formula (2ᵍ-iia):

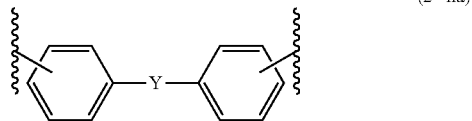

(2ᵍ-iia)

wherein Y is a bond, a $C_{1-6}$ alkylene group that may be substituted with a $C_{1-4}$ alkyl group, an oxygen atom (—O—), a sulfur atom (—S—), —SO—, or —SO$_2$—;
$R^1$ is the same or different, and is a $C_{1-18}$ alkyl group, a $C_{2-9}$ alkenyl group, a cycloalkyl group, an aryl group, or an aralkyl group, wherein one or more carbon atoms of these groups may be replaced by at least one atom selected from the group consisting of an oxygen atom and a nitrogen atom;
$R^2$ is the same or different, and is a $C_{1-18}$ alkylene group, wherein one or more carbon atoms of this group other than a carbon atom directly bonded to a silicon atom may be replaced by at least one atom selected from the group consisting of an oxygen atom and a nitrogen atom;
$R^3$ is the same or different, and is a $C_{1-18}$ alkyl group, a $C_{2-9}$ alkenyl group, a cycloalkyl group, an aryl group, or an aralkyl group, wherein one or more carbon atoms of these groups may be replaced by at least one atom selected from the group consisting of an oxygen atom and a nitrogen atom;
m is an integer of 0 to 6; and
n is an integer of 0 to 3; and
an epoxy resin represented by the formula (1-iiia):

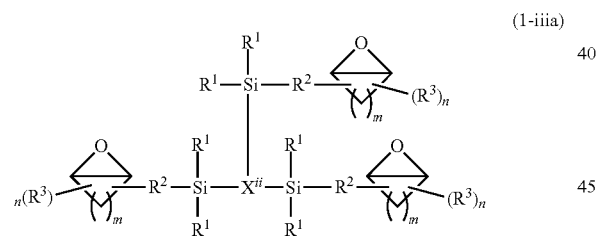

(1-iiia)

wherein $X^{iii}$ is a trivalent group obtained by removing three hydrogen atoms from a saturated hydrocarbon ring or an unsaturated hydrocarbon ring, or from rings having a structure in which 2 to 6 saturated hydrocarbon rings and/or unsaturated hydrocarbon rings are condensed;
or a trivalent group represented by the formula (2ᵍ-iiia):

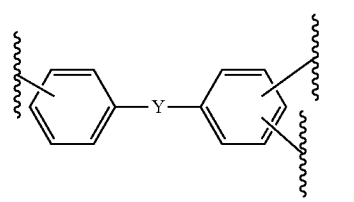

(2ᵍ-iiia)

wherein Y is as defined above; and
$R^1$, $R^2$, $R^3$, m, and n are as defined above,
wherein the acid-modified polyolefin resin is at least one member selected from the group consisting of an acid-modified polyolefin resin obtained by grafting a polyolefin resin with an acid-modified group, an acid-modified polyolefin resin obtained by copolymerizing an olefin and at least one of an unsaturated carboxylic acid and/or an acid anhydride thereof, and acid-modified polyolefin resins obtained by hydrogenating these acid-modified polyolefin resins.

2. The epoxy resin composition according to claim 1, wherein the saturated hydrocarbon ring is a $C_{4-8}$ saturated hydrocarbon ring, and the unsaturated hydrocarbon ring is a $C_{4-8}$ unsaturated hydrocarbon ring.

3. The epoxy resin composition according to claim 1, wherein the composition comprises an acid-modified polyolefin resin and at least one epoxy resin selected from the group consisting of:
an epoxy resin represented by the formula (1-IIa):

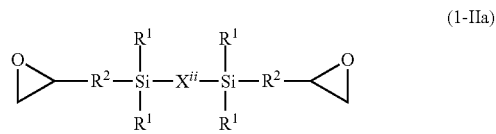

(1-IIa)

wherein $R^1$, $R^2$, and $X^{ii}$ are as defined in claim 1,
an epoxy resin represented by the formula (1-IIb):

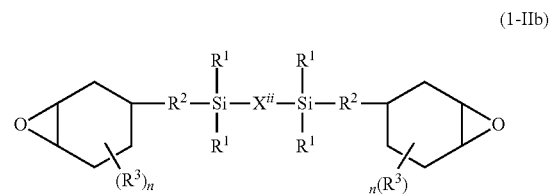

(1-IIb)

wherein $R^1$, $R^2$, $R^3$, $X^{ii}$, and n are as defined in claim 1, and
an epoxy resin represented by the formula (1-IIIa):

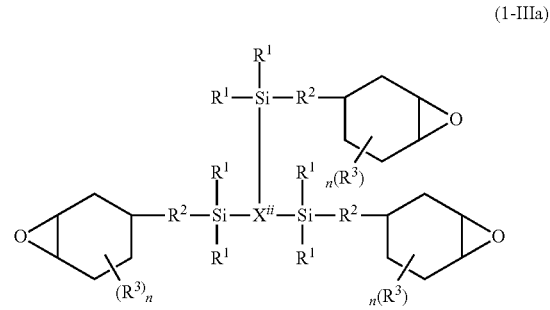

(1-IIIa)

wherein $R^1$, $R^2$, $R^3$, $X^{iii}$, and n are as defined in claim 1.

4. The epoxy resin composition according to claim 1, wherein the acid-modified polyolefin resin has an acid value (mgKOH/g) of 0.5 to 500.

5. A varnish comprising the epoxy resin composition according to claim 1 and an organic solvent.

6. A cured product of the epoxy resin composition according to claim 1.

7. A semiconductor sealing material, a liquid sealing material, a potting material, a sealing material, an interlayer insulation film, an adhesive layer, a coverlay film, an electromagnetic shielding film, a printed circuit board material, or a composite material, each of which uses the epoxy resin composition according to claim 1.

8. A semiconductor sealing material, a liquid sealing material, a potting material, a sealing material, an interlayer insulation film, an adhesive layer, a coverlay film, an electromagnetic shielding film, a printed circuit board material, or a composite material, each of which uses the varnish according to claim 5.

9. A semiconductor sealing material, a liquid sealing material, a potting material, a sealing material, an interlayer insulation film, an adhesive layer, a coverlay film, an electromagnetic shielding film, a printed circuit board material, or a composite material, each of which uses the cured product according to claim 6.

10. The epoxy resin composition according to claim 1, wherein the acid-modified polyolefin resin is an acid-modified polyolefin resin obtained by grafting a polyolefin resin with an acid-modified group, the polyolefin resin is at least one member selected from the group consisting of polyethylene, polypropylene, and an olefin copolymer, and the acid-modified group is a maleic anhydride group.

11. The epoxy resin composition according to claim 1, wherein the acid-modified polyolefin resin is at least one member selected from the group consisting of a styrene-maleic anhydride copolymer, an ethylene-maleic anhydride copolymer, a propylene-maleic anhydride copolymer, and an isobutylene-maleic anhydride copolymer.

12. The epoxy resin composition according to claim 1, wherein the acid-modified polyolefin resin is obtained by hydrogenating a resin obtained by grafting a polyolefin resin with an acid-modified group, the polyolefin resin is at least one member selected from the group consisting of polyethylene, polypropylene, and an olefin copolymer, and the acid-modified group is a maleic anhydride group.

13. The epoxy resin composition according to claim 1, wherein the acid-modified polyolefin resin is obtained by hydrogenating at least one member selected from the group consisting of a styrene-maleic anhydride copolymer, an ethylene-maleic anhydride copolymer, a propylene-maleic anhydride copolymer, and an isobutylene-maleic anhydride copolymer.

* * * * *